United States Patent
McCulloch et al.

(10) Patent No.: US 11,126,316 B2
(45) Date of Patent: Sep. 21, 2021

(54) CAPACITIVE TOUCH SENSOR APPARATUS HAVING ELECTROMECHANICAL RESONATORS

(71) Applicant: 1004335 ONTARIO INC., Ottawa (CA)

(72) Inventors: Robert Donald McCulloch, Ottawa (CA); Guy Michael Amyon Farquharson Duxbury, Ottawa (CA); Albert M. David, Manotick (CA); Gueorgui Pavlov, Ottawa (CA)

(73) Assignee: 1004335 ONTARIO INC., Ottawa (CA)

( * ) Notice: Subject to any disclaimer, the term of this patent is extended or adjusted under 35 U.S.C. 154(b) by 0 days.

(21) Appl. No.: 16/956,414

(22) PCT Filed: Dec. 21, 2018

(86) PCT No.: PCT/CA2018/051645
§ 371 (c)(1),
(2) Date: Jun. 19, 2020

(87) PCT Pub. No.: WO2019/119147
PCT Pub. Date: Jun. 27, 2019

(65) Prior Publication Data
US 2021/0089185 A1    Mar. 25, 2021

Related U.S. Application Data

(60) Provisional application No. 62/609,851, filed on Dec. 22, 2017.

(51) Int. Cl.
*G06F 3/041* (2006.01)
*G06F 3/044* (2006.01)

(52) U.S. Cl.
CPC ........ *G06F 3/0446* (2019.05); *G06F 3/04166* (2019.05); *G06F 3/04164* (2019.05)

(58) Field of Classification Search
None
See application file for complete search history.

(56) References Cited

U.S. PATENT DOCUMENTS

| 5,863,821 A | 1/1999 | Chao |
| 6,080,632 A | 6/2000 | Chao |

(Continued)

FOREIGN PATENT DOCUMENTS

| WO | 2013016765 A1 | 2/2013 |
| WO | 2015115307 A1 | 8/2015 |
| WO | WO 2017/219124 A1 | 12/2017 |

OTHER PUBLICATIONS

International Search Report and Written Opinion in corresponding Application No. PCT/CA2018/051644, dated Apr. 8, 2019, (9 pages).

(Continued)

*Primary Examiner* — Krishna P Neupane
(74) *Attorney, Agent, or Firm* — Bookoff McAndrews, PLLC

(57) ABSTRACT

In a frequency multiplexed capacitive touch sensor, a plurality of resonance frequencies may be used to drive electrodes for sensing touch. A capacitive touch sensor apparatus is provided that includes a substrate layer and a plurality of resonant circuits. Each resonant circuit comprises a respective electrode and a respective electromechanical resonator connected to the respective electrode. The electromechanical resonators comprise any suitable high-Q resonator including, but not limited to: ceramic oscillators; crystal oscillators; and MEMs oscillators, as described above. The electrodes of the plurality of resonant circuits are distributed on the substrate layer. The electromechanical resonators (Continued)

may allow relatively close spacing of adjacent resonance frequencies, in comparison to resonant circuits with discrete inductors.

20 Claims, 13 Drawing Sheets

(56) References Cited

U.S. PATENT DOCUMENTS

| | | |
|---|---|---|
| 6,385,430 B1 | 5/2002 | Jackson et al. |
| 7,864,503 B2 | 1/2011 | Chang |
| 8,179,381 B2 | 5/2012 | Frey et al. |
| 8,217,902 B2 | 7/2012 | Chang et al. |
| 8,547,118 B1 | 10/2013 | Vojjala et al. |
| 9,141,227 B2 | 9/2015 | Hristov et al. |
| 9,146,645 B2 | 9/2015 | Yang |
| 9,658,726 B2 | 5/2017 | Rowe et al. |
| 9,829,523 B1 | 11/2017 | Peterson et al. |
| 10,423,285 B2 | 9/2019 | Church et al. |
| 10,540,030 B2 | 1/2020 | Kim et al. |
| 2003/0155842 A1 | 8/2003 | Hobelsberger |
| 2005/0030048 A1 | 2/2005 | Bolender et al. |
| 2006/0072113 A1 | 4/2006 | Ran |
| 2007/0257894 A1 | 11/2007 | Philipp |
| 2009/0066895 A1 | 3/2009 | Kuo et al. |
| 2009/0194344 A1 | 8/2009 | Harley et al. |
| 2010/0079384 A1 | 4/2010 | Grivna |
| 2010/0123670 A1 | 5/2010 | Phillipp |
| 2010/0156810 A1 | 6/2010 | Barbier et al. |
| 2010/0302201 A1 | 12/2010 | Ritter et al. |
| 2011/0025639 A1 | 2/2011 | Trend et al. |
| 2011/0132642 A1 | 6/2011 | Shinoda et al. |
| 2012/0062472 A1 | 3/2012 | Yilmaz |
| 2012/0162099 A1 | 6/2012 | Yoo et al. |
| 2012/0169401 A1 | 7/2012 | Hristov et al. |
| 2012/0287068 A1 | 11/2012 | Colgate et al. |
| 2013/0033450 A1* | 2/2013 | Coulson ............... G06F 3/041 345/174 |
| 2013/0207911 A1 | 8/2013 | Barton et al. |
| 2013/0277091 A1 | 10/2013 | Chang et al. |
| 2014/0022202 A1 | 1/2014 | Badaye et al. |
| 2014/0078068 A1 | 3/2014 | Jones et al. |
| 2014/0092056 A1* | 4/2014 | Jhou .................... G06F 3/0446 345/174 |
| 2014/0152621 A1* | 6/2014 | Okayama ............. G06F 3/0446 345/174 |
| 2014/0168147 A1 | 6/2014 | Huang |
| 2014/0232681 A1 | 8/2014 | Yeh |
| 2014/0296808 A1 | 10/2014 | Curran et al. |
| 2014/0300833 A1 | 10/2014 | Yang |
| 2015/0041302 A1 | 2/2015 | Okumura et al. |
| 2015/0241924 A1 | 8/2015 | Chang et al. |
| 2016/0018940 A1* | 1/2016 | Lo ........................ G06F 3/0446 345/174 |
| 2017/0075456 A1 | 3/2017 | Lai et al. |
| 2017/0123546 A1 | 5/2017 | Zhan et al. |
| 2018/0138889 A1* | 5/2018 | Rinaldi .................... H01P 1/20 |
| 2018/0185630 A1 | 7/2018 | Fenton et al. |
| 2018/0188881 A1* | 7/2018 | Kyoung ................ G06F 3/0443 |
| 2018/0211904 A1 | 7/2018 | Cho et al. |
| 2018/0224966 A1 | 8/2018 | Church et al. |
| 2018/0224968 A1 | 8/2018 | Church et al. |
| 2018/0314386 A1 | 11/2018 | Tsai et al. |
| 2019/0087033 A1 | 3/2019 | Son et al. |
| 2020/0310596 A1 | 10/2020 | Glad |

OTHER PUBLICATIONS

International Search Report and Written Opinion in corresponding Application No. PCT/CA2018/051645, dated Mar. 11, 2019, (8 pages).
Walker, "Fundamentals of Projected-Capacitive Touch Technology", Jun. 1, 2014, (196 pages).
Wang et al. "Multi-Channel Capacitive Sensor Arrays." *Sensors;16*, 150, pp. 1-12, 2016 (12 pages).
International Search Report for PCT/CA2018/051645, dated Mar. 11, 2019 (3 pages).
International Preliminary Report on Patentability for PCT/CA2018/051645, dated Jan. 2, 2020 (3 pages).

* cited by examiner

CAPACITIVE TOUCH SENSOR APPARATUS HAVING ELECTROMECHANICAL RESONATORS

RELATED APPLICATION

This application is the U.S. National Phase entry under 35 U.S.C. § 371 of International Application No. PCT/CA2018/051645, filed Dec. 21, 2018, which claims priority to U.S. Provisional Patent Application Ser. No. 62/609,851, filed Dec. 22, 2017.

FIELD OF THE DISCLOSURE

The present disclosure relates generally to capacitive touch sensing technology, and more particularly to capacitive touch sensor apparatuses utilizing multiple resonance frequencies.

BACKGROUND

A capacitive touch sensor (e.g. for a touchscreen) typically comprises a two-dimensional criss-cross array of substantially transparent conductive electrodes arranged on a substrate layer. The electrodes may typically be strips made of indium-tin-oxide (ITO). A protective top layer of glass or plastic will typically cover the substrate layer and the conductive strips.

An electronic tone signal may be input to the electrodes either collectively or individually. When a human finger (or another conductive member) is applied over one of the electrodes, the capacitance of this electrode with respect to ground changes, and this change in capacitance is detectable. Thus, by monitoring the output from each electrode, it can be determined where the sensor was touched. For two-dimensional sensing, two overlapping sets of electrodes in perpendicular directions may be monitored, thereby allowing for determination of the position of the touch in two dimensions.

Conventional capacitive touch sensors may use self-capacitance or mutual capacitance. In self-capacitance touch sensors, the capacitance to ground of each electrode or "channel" is detected separately using a fast changing signal such as a fast rising edge or frequency tone above 1 MHz. In mutual capacitance touch sensors, the mutual capacitance between two channels (e.g. two perpendicular channels) is detected. For example, in a grid of vertical and horizontal (X and Y) electrodes, the mutual capacitances between the horizontal and vertical electrodes are monitored. In a typical two-dimensional electrode grid, each horizontal electrode forms a capacitance with each vertical electrode where they are in close proximity to each other (near their intersection/overlap).

One method of detecting changes in capacitance is by individually monitoring circuit responses for changes. If a modulated voltage is applied, the impedance of a circuit including an electrode depends on the frequency of the applied signal. The frequency response of the circuit depends on the capacitance value of the circuit, which can be arranged to have a contribution from touch screen electrode self-capacitance or the mutual capacitance of a pair of perpendicular touch screen electrodes. When the capacitance of a touch screen electrode (or the mutual capacitance of a pair of perpendicular electrodes) changes, the frequency response for that circuit also changes. Thus, a change in the voltage at a test point on the circuit may be detected due to the impedance change.

A circuit including one or more electrode strips on a substrate may commonly be referred to as a "channel". A conventional capacitive touch sensor may include multiple channels. The multiple channels are typically sequentially scanned. Scanning is typically accomplished by sequentially exciting electrodes of the channels with an input signal at a given frequency or pulse signals.

SUMMARY

According to an aspect, there is provided a capacitive touch sensor apparatus comprising: a substrate layer; and a plurality of resonant circuits, each comprising: a respective electrode, the electrodes of the plurality of resonant circuits being distributed on the substrate layer; and a respective electromechanical resonator connected to the respective electrode.

In some embodiments, the electromechanical resonators comprise one or more ceramic resonators.

In some embodiments, the electromechanical resonators comprise one or more crystal resonators.

In some embodiments, the electromechanical resonators comprise one or more MEMs resonators.

In some embodiments, each electromechanical resonator has a Q factor of at least 200.

In some embodiments, the electromechanical resonators are tunable, such that the resonant circuits comprise tunable resonant filters.

In some embodiments, each electromechanical resonator is connected between the respective electrode and a drive input.

In some embodiments, each resonant circuit further comprises a parallel capacitor connected between the respective electrode and a device ground.

In some embodiments, each resonant circuit further comprises a resistor connected in parallel with the capacitor between the respective electrode and ground.

In some embodiments, each resonant circuit further comprises a resistor connected between the respective electrode and the drive input.

In some embodiments, the plurality of resonant circuits have a plurality of resonance frequencies.

In some embodiments, the plurality of resonance frequencies are spaced apart from each other by a frequency separation of at least 40 kHz.

According to another aspect, there is provided a controller for a capacitive touch sensor apparatus: comprising: a processor; a signal generator, operably connected to the processor, that generates, as output, drive signals at or near a plurality of resonance frequencies to drive a capacitive touch sensor apparatus; a broadband filter that receives, as input, signals output from the capacitive touch sensor apparatus; a detector that receives the signals from the capacitive touch sensor apparatus, thus filtered by the broadband filter.

In some embodiments, the broadband filter has a passband that encompasses all of the plurality of resonance frequencies.

In some embodiments, the controller further comprises a pre-amplifier that amplifies the signals output from the capacitive touch sensor apparatus prior to the signals being input to the broadband filter.

In some embodiments, the controller further comprises a switch, a first output terminal and a second output terminal, wherein the switch is controllable by the processor to selectively direct the drive signals to the first input/output terminal and the second input/output terminal.

According to another aspect, there is provided a method for a capacitive touch sensor comprising a plurality of resonant circuits having a plurality of resonance frequencies, the method comprising: exciting the plurality of resonant circuits with signals at or near the plurality of resonance frequencies, each of the resonant circuits comprising an electromechanical resonator; receiving response signals from the plurality of resonant circuits; and detecting one or more touch events by measuring the filtered response signals.

In some embodiments, the method further comprises filtering the response signals with a broadband filter, and the broadband filter has a passband that encompasses the plurality of resonance frequencies.

In some embodiments, the method further comprises, prior to said filtering, amplifying the response signals.

In some embodiments, the electromechanical resonators comprise at least one of: ceramic resonators; crystal resonators; and MEMs resonators.

Other aspects and features of the present disclosure will become apparent, to those ordinarily skilled in the art, upon review of the following description of the specific embodiments of the disclosure.

BRIEF DESCRIPTION OF THE DRAWINGS

The present disclosure will be better understood having regard to the drawings in which.

DETAILED DESCRIPTION

Figure 1:
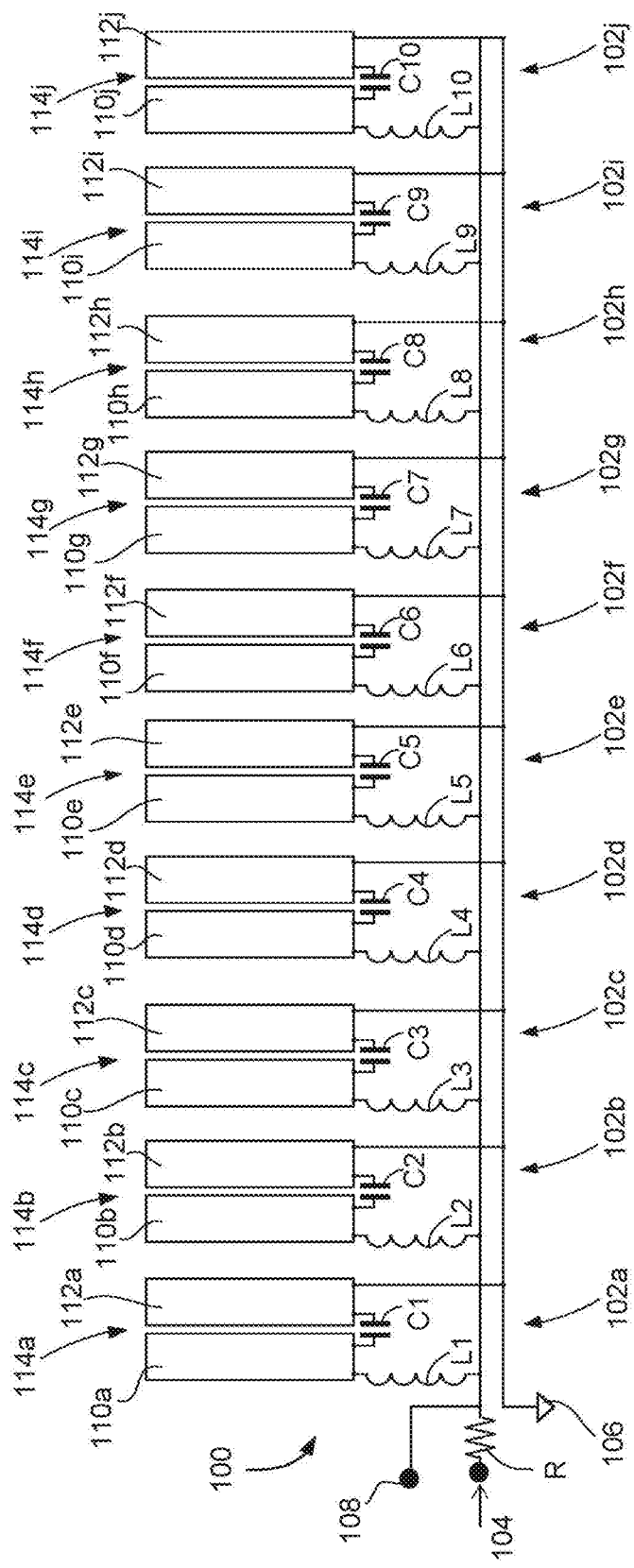
FIG. 1 is a schematic diagram of an example frequency multiplexing capacitive touch circuit for a touch sensor apparatus.

The present disclosure provides capacitive touch sensing apparatuses, controllers and related methods, which may be used for touch sensor apparatuses (e.g. in a touchscreen) that may be engaged with a finger or fingers, or any other conductive object such as a stylus. The touch sensor may implement one-dimensional or two-dimensional sensing.

The embodiments shown in the figures and described below are capacitive touch sensors that may, for example, operate in the 1-30 MHz range. However, aspects of the disclosure may also be implemented in touch sensors using other signal frequencies.

In the following description, two generally orthogonal sets of electrodes may be referred to as "vertical" and "horizontal" electrodes, or alternatively as "X" and "Y" electrodes because they are used to determine position along the X-axis and Y-axis respectively. However, it is to be understood that the terms "vertical" and "horizontal" (or "X" and "Y") are used simply for ease of description and illustrative purposes, and embodiments are not limited to a particular orientation of the electrodes or a touch sensor apparatus.

As discussed above, capacitive touch sensors typically comprise a plurality of electrode strips distributed on a substrate, where the electrodes are sequentially driven by an electronic tone signal and the output is monitored. Changes in output due to a touch event are detected and are used to determine where the sensor was touched. The electrodes may be driven by the same frequency of signal, and each electrode has a separate electrical connection to a controller that selectively drives the electrodes and monitors the outputs. This configuration may be referred to as a "time multiplexing" configuration, and may require a large number of connections between the electrodes in the touch sensor apparatus and the controller comprising a signal generator to drive the apparatus and a detector to detect the output from the apparatus. For example, a touch sensor apparatus with a 10×10 grid of electrode channels may typically require 20 separate input and output connections and sometimes more connections for mutual capacitance configurations. The input signal may be an electronic tone signal at a single frequency (or alternatively a series of pulses) that is time-multiplexed to all input connections.

In purely time multiplexed touch sensors a high number of separate connections (one for each channel) may result in the connection tracks, or traces, to be narrow and very close together. This may result in significant crosstalk between the traces. The interconnect between the touch sensor panel and a controller may also be large due to the number of connections.

Frequency multiplexing, on the other hand may allow one or more pluralities of electrodes to collectively share input and output connections. For frequency multiplexing, each of a plurality of channels comprises a respective resonant circuit including an electrode, and each of the plurality of resonance circuits has a unique resonance frequency for that plurality of channels. The resonant circuits may comprise LC components chosen to provide the desired set of resonance frequencies. Input signals at or near each of the resonance frequencies drive all of the plurality of electrodes concurrently. The input signals cycle through the different resonance frequencies. By monitoring which frequency or frequencies experience an output change, it can be determined which one or more of the electrodes are in proximity of a finger (or other object) touching the sensor. As used herein, the expression "at or near a resonance frequency" of a resonant circuit may be understood as meaning "within the resonant band of" the resonant circuit. For example, in some embodiments, the signals driving the resonant circuits (channels) may be deliberately slightly offset so that the change in output level is more drastic due to touch (i.e. the input signal frequency is moved slightly from the peak resonance if the resonant circuit and closer to the steep edge of the frequency response curve).

Examples of frequency multiplexing touch sensor apparatus configurations are disclosed in International PCT Patent Publication No. 2017/219124, the entire content of which is incorporated herein by reference.

FIG. 1 is a schematic diagram of an example frequency multiplexing capacitive touch circuit 100 for a touch sensor apparatus (e.g. touch panel or touchscreen). The capacitive touch circuit 100 in FIG. 1 includes a plurality of resonant circuits 102a to 102j collectively connected to an electronic tone signal input 104, via a resistor R, and to ground 106. The electronic tone signal input 104 may be output from a signal generator (not shown). Ten resonant circuits 102a to 102j are shown in FIG. 1, but the actual number of resonant circuits will vary in other embodiments. The capacitive touch circuit 100 also includes a circuit output connection 108 connected to each of the resonant circuits 102a to 102j. The resonant circuits 102a to 102j are connected in parallel to the electronic tone signal input 104 (via resistor R). The circuit output connection 108 and electronic tone signal input 104 are connected to opposite terminals of the resistor R in this embodiment.

The first resonant circuit 102a includes an inductor L1, a capacitor C1, a first ITO strip 110a and a second ITO strip 112a. The first and second ITO strips 110a and 112a form a pair and run parallel to each other. The ITO strips are deposited onto a transparent dielectric substrate layer (not shown). The first and second ITO strips effectively form a capacitor. Each conductive ITO strip 110a/112a may form a capacitor of around 50-200 pF in value, for example. A protective top layer of glass or plastic may cover the substrate layer and the conductive ITO strips 110a and 112a.

The capacitor C1 is connected between the first and second ITO strips 110a and 112a, thus being connected parallel to the capacitor formed by the first and second parallel and spaced apart ITO strips 110a and 112a. The capacitance of the pair of ITO strips 110a and 112a is extremely low, and the capacitor C1 and the pair of ITO strips 110a and 112a together may typically provide a total capacitance several times higher than the capacitance created by the touching finger. However, embodiments are not limited to such arrangements.

Embodiments are not limited to ITO electrodes, and other conductive (possibly transparent, translucent, or opaque but very fine conductive) materials may be used. Electrodes may be deposited or printed using a chemical process, or otherwise printed onto the substrate layer. Typical ITO strips may have a resistance of approximately 100 Ohms/square. A relatively low resistance of the electrode strips may be preferable to reduce diminishment of the electronic tone signals. Electrodes formed by a fine metal mesh may provide a lower resistance than ITO strips, and may, therefore, be more suitable for larger touch panels. Embodiments are not limited to any particular type of electrode. The shape of the electrodes may also vary and electrodes are not necessarily strips. For example, some embodiments may include electrodes in one or more other shapes such as rectangles or circles, rather than strips.

The inductor L1 is connected between the electronic tone signal input 104 (via resistor R) and the first ITO strip 110a. The second ITO strip 112a is connected to ground (as well as the capacitor C1). Thus, as shown in FIG. 1, the inductor L1 of the first resonant circuit is in series with the capacitor C1 and the effective capacitor formed by the parallel first and second ITO strips 110a and 112a. By way of example, the fixed capacitor C1 may be in the range of 80 pF to 300 pF. The value of the fixed inductance L1 in this example may be in the range of 2 µH to 50 µH, such that the resonance frequency is in the single digit megahertz range.

The remaining resonant circuits 102b to 102j are all similarly arranged with respective capacitors (C2, C3, C4, C5, C6, C7, C8, C9, C10), inductors (L2, L3, L4, L5, L6, L7, L8, L9 and L10), first ITO strips (110b, 110c, 110d, 110e, 110f, 110g, 110h, 110i, 110j) and second ITO strips (112b, 112c, 112d, 112e, 112f, 112g, 112h, 112i, 112j), together forming respective touch sensitive "channels" 114b to 114j. The capacitance values of the capacitors (C1 to C10) and/or the inductance of the inductors (L1 to L10) are varied such that the resonance frequencies of the resonant circuits 102b to 102j are unique and spaced apart. For example, the resonance frequencies may be separated by frequency separations of 0.4 to 1.5 MHz (although embodiments are not limited to any particular maximum or minimum separation. By way of example, to provide unique resonance frequencies, the inductances may be the same, but in this example, the inductance value is the same for all inductors L1 to L10, but the capacitors C1 to C10 may each have a different capacitance as follows: first capacitor C1 is 220 pF; second capacitor C2 is 180 pF, third capacitor C3 is 150 pF; fourth capacitor C4 is 120 pF; fifth capacitor C5 is 100 pF; sixth capacitor C6 is 180 pF, seventh capacitor C7 is 68 pF; eighth capacitor C8 is 58 pF; ninth capacitor C9 is 47 pF; and tenth capacitor C10 is 39 pF.

The first ITO strips 110a to 110j of each resonant circuit may be considered "sensing electrodes". The second ITO strips 112a to 112j of each resonant circuit are electrodes connected to ground ("ground electrodes"). A finger near a pair of the strips will add or change capacitance between the "sensing electrode" and the "ground electrode" which changes the resonance of that resonant circuit (channel). However, embodiments are not limited to resonant circuits with ground electrodes. Rather, resonant circuits may each comprise a single sensing electrode and omit ground electrodes. See, for example, the examples of FIGS. 5, 7, 8, and 11 described below. Omitting ground electrodes may improve the detection resolution of the screen because sensing electrodes may be placed closer together. Resonant circuits with only sensing electrodes (omitting ground electrodes) may work sufficiently or equally well for detecting changes due to touch events because the body of a person touching the sensor has a much larger capacitance to true ground than the capacitance of the finger to the active electrode. The capacitance between the touch sensor apparatus and true ground may also be much larger than the capacitance of the finger to the active electrode.

The inductors L1 to L10 and capacitors C1 to C10 in these resonant circuits 102a to 102j are chosen to provide a set of unique resonance frequencies, where each resonant circuit resonates at a different frequency. The resonance frequencies are unique within the resonant circuits 102a to 102j. However, in embodiments including multiple sets of resonant circuits, resonance frequencies in two or more sets may overlap. The set of unique frequencies may be chosen based on a permissible tuning range and bandwidth of the electronic tone signal input 104. For example, in certain environments, the allowable electronic tone frequency operating bandwidth may be limited or dictated by regulations, other equipment, etc. The spread between adjacent resonance frequencies for the channels may be chosen to be sufficiently large to enable clear distinction between channels, though the actual spread may vary in different embodiments.

The capacitors C1 to C10 may be lumped circuit elements or they may be made as part of multilayer touch panel structure. For example, the capacitors C1 to C10 may be chip capacitors or may be formed by a deposition of one or more additional layers of conductive and dielectric material on the substrate layer. A multilayer structure may be preferable since it may typically not be practical to solder surface mount chip capacitors on a glass or any dielectric substrate. The inductors L1 to L10 may also be lumped circuit elements or they may be made as part of multilayer touch panel structure. The capacitors C1 to C10 and inductors L1 to L10 may be located in the bezel of a touch screen device that includes the touch circuit 100 of FIG. 1.

It may be possible to distinguish a touch on any particular channel 114a to 114j, as will be discussed in more detail below. The touch sensitive channels 114a to 114j may be distributed on the substrate layer to form a one-dimensional touch sensor system. For example, the ITO strips 110a to 110j and 112a to 112j of the channels 114a to 114j may extend substantially across the substrate layer to form a touch sensitive panel.

Figure 2A:
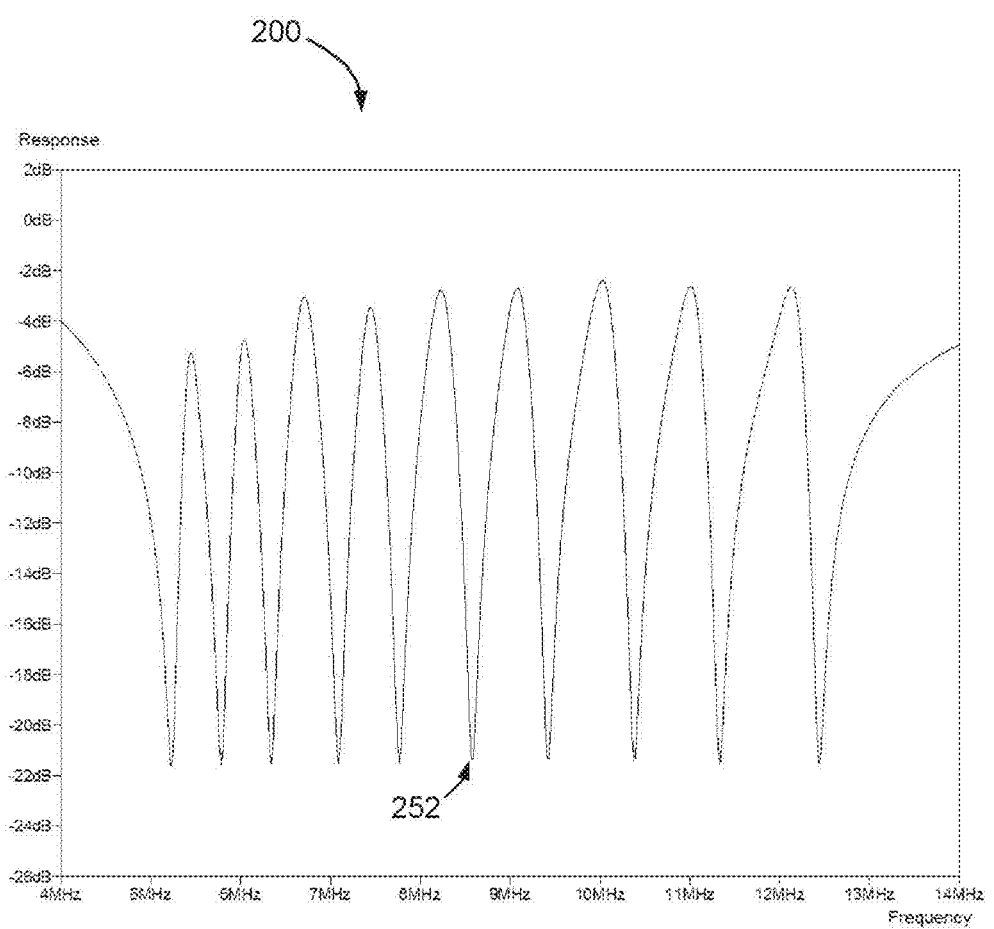
FIG. 2A shows a graph of a simulated frequency response of the capacitive touch circuit shown in FIG. 1 in the absence of touch.
Figure 2B:
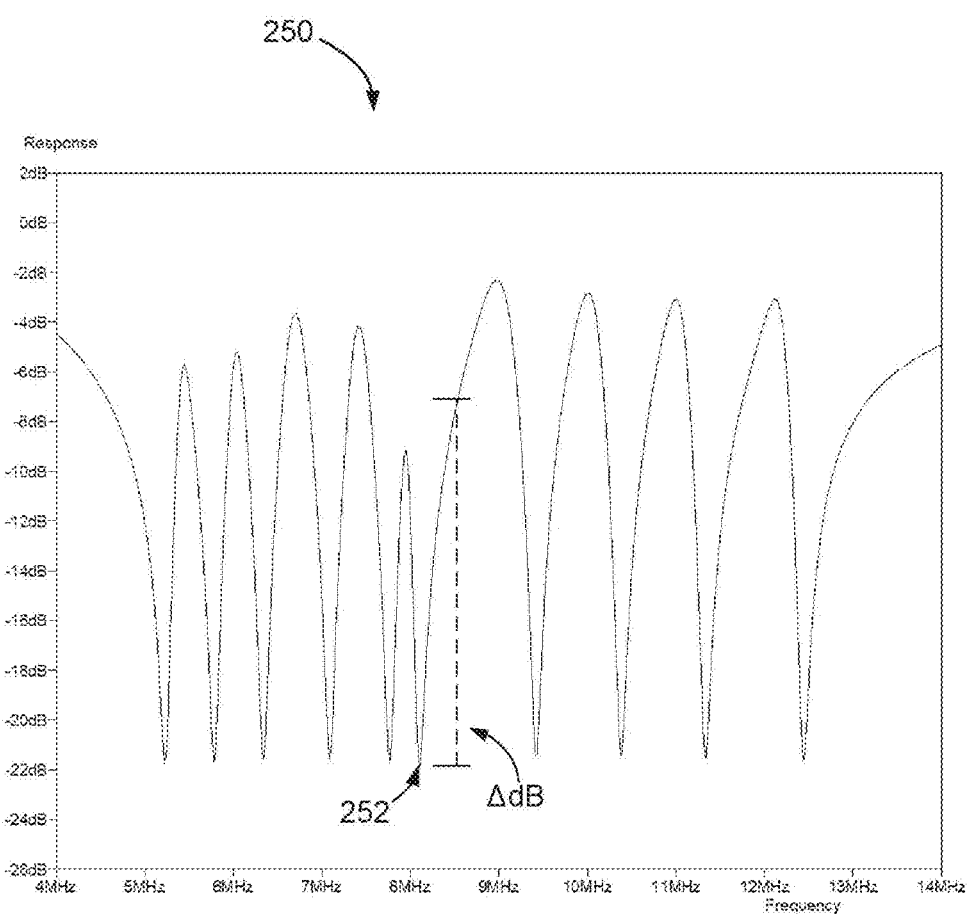
FIG. 2B shows a graph of a simulated frequency response of the capacitive touch circuit shown in FIG. 1 in the presence of a touch.

FIG. 2A shows a graph 200 of a simulated frequency response of the capacitive touch circuit 100 shown in FIG. 1 when none of the channels 114a to 114j is touched. The simulation was produced in Spice™. As shown in FIG. 2A, the circuit includes 10 resonance frequencies indicated by the 10 separate valleys or drops in the response decibel level. FIG. 2B shows a graph 250 of a simulated frequency response of the capacitive touch circuit 100 shown in FIG. 1 when the sixth channel 114f (shown in FIG. 1) is touched. As shown, the sixth resonance frequency 252 (also shown in FIG. 2A) has shifted from about 8.57 MHz to about 8.11 MHz, due to the capacitance of the channel increasing by approximately 10 pF because of the finger touch.

A finger touch may typically add a capacitance (Cf) in the order of 0.5 pF (or less) to 10 pF. The values of the capacitors (C1 to C10) of the resonant circuits may be set at several times higher than the expected Cf (e.g. 10 to 200 times higher).

If the applied electronic tone input is tuned to 8.57 MHz, then by touching the corresponding pair of ITO strips, the measured response signal amplitude of the capacitive touch circuit 100 will change the amount AdB shown in FIG. 2B (which is approximately 15 dB in this example). The change in response level, when detected, is treated as a touch event for the sixth channel 114f. The magnitude of the response may be an indication of extent to which the channel is being touched.

Figure 3:
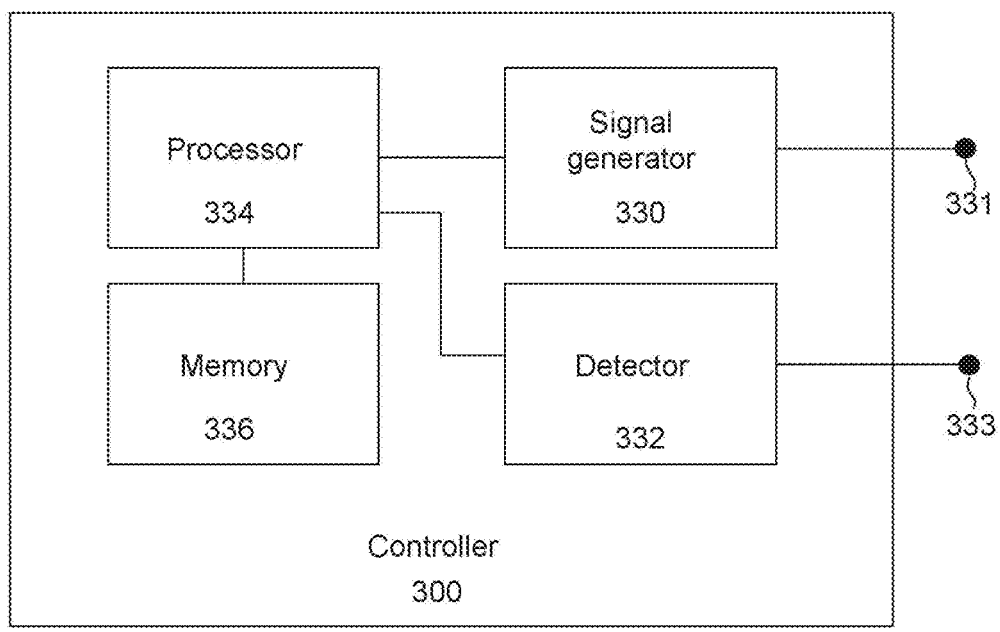
FIG. 3 is a block diagram of a controller for a capacitive touch sensor according to some embodiments.

FIG. 3 is a block diagram of a controller 300 for a capacitive touch sensor apparatus according to some embodiments. In some embodiments, the controller 300 is part of the touch sensor apparatus. The controller 300 may be used to control the capacitive touch sensor circuit 100 shown in FIG. 1 as well as other capacitive touch circuits in various devices.

The controller includes a tuneable electronic tone signal generator 330 connected to controller output 331, a detector 332 connected to controller input 333, a processor 334, and a memory 336. The processor 334 and memory 336 together act as control circuitry for the controller 300. The memory 336 may store processor executable instructions thereon that, when executed by the processor 334, cause the processor to control the electronic tone signal generator 330 and the detector 332 as described herein. Control circuitry may comprise any combination of hardware (e.g. microprocessor, memory, or other hardware) and/or software and embodiments are not limited to the particular example shown in FIG. 3. Output of the tuneable electronic tone signal generator 330 may be input to the capacitive touch sensor circuit (via connection to controller output 331) to excite a plurality of resonant circuits. The detector 332 is connected to the processor 334. The tuneable electronic tone signal generator 330 is connected to and controlled by the processor 334. The detector 332 receives and measures a response from the capacitive touch sensor circuit via controller input 333. The memory 336 is connected to the processor 334 and stores executable instructions thereon to cause the processor 334 to control the electronic tone signal generator 330 and the detector 332 as described below. In other embodiments, the processor 334 may be configured without use of external memory to control the electronic tone signal generator 330 and the detector 332.

The controller 300 shown in FIG. 3 may be connected to control the capacitive touch circuit 100 shown in FIG. 1. Specifically, the controller output 331 (FIG. 3) may be connected to the electronic tone signal input 104 (FIG. 1) of the touch circuit 100, and the controller input 333 (FIG. 3) may be connected to the circuit output connection 108 (FIG. 1) of the touch circuit 100. In operation, the electronic tone signal generator 330 of the controller 300 may sequentially scan the unique resonance frequencies of all channels 114a to 114j of the capacitive touch circuit 100 to detect and quantify the extent of touch events on the channels 114a to 114j. The channels 114a to 114j may be scanned sequentially or in any order. If more than one channel 114a to 114j indicates a touch event, a multi-touch event is registered. The scanning sequence may follow a repeating sequence or a hopping pattern.

To perform the scanning functionality, the processor 334 of the controller 300 controls the electronic tone signal generator 330 to selectively and sequentially generate electronic tone signals at (or near) each of the unique resonance frequencies to excite the channels 114a to 114j. The detector 332 measures the response received by the controller (via controller input 333) at circuit output connection 108 in FIG. 1 and passes the measurements to the processor. The detector 332 may include an Analog to Digital Converter (ADC) for converting the response to digital signals for transmission to the processor 334. The detector 332 and/or the processor 334 may also include a comparator to compare the measured response levels to the expected non-touch response level. The processor 334 analyzes the measurements to detect touch events on the channels. For example, if there is a change from the expected amplitude response for a particular resonance frequency, then the processor 334 determines that the corresponding channel 114a to 114j corresponding to that resonance frequency is touched and the extent of that touch. The input generated by the electronic tone signal generator may remain at a given selected frequency for period of time. When multiple capacitance changes are detected on multiple channels, the microcontroller may register a multiple touch event.

The response (e.g. measured by the detector 332 in FIG. 3) may be a measured amplitude of the voltage from the capacitive touch circuit. The response may alternatively be a measured frequency of the peak voltage response from the capacitive touch circuit.

In other embodiments, some or all of the controller circuitry (including the tuneable signal generator, the detector and/or the detector's ADC) may be integrated directly into a touch sensor apparatus rather than included in a separate controller.

In some embodiments, rather than individually and sequentially exciting each channel, two or more channels may be excited concurrently and the frequency response of multiple channels may be measured. For example, all of the plurality of channels may be excited at once (or in batches) using excitation signals having broad frequency content. Measuring the channel responses (e.g. by the detector 332 in FIG. 3) may be performed by measuring the frequency component content of the resulting collective response signal during excitation or as the energy of the excitation diminishes. In other words, the detector circuit may sample and analyze the resulting collective response of all the excited channels and discern the frequencies and/or amplitudes of each resonance to determine which channel(s) is/are touched and the extent of each touch.

In some embodiments, two perpendicular sets of channels may be used to provide a two-dimensional touch sensor (such as a touchscreen for a mobile device or other electronic display panel). The system may still only use a single electronic tone source for channel excitation and a single touch registration response. Alternatively, two different electronic tone signal sources may drive the two sets. Each of the channels of both perpendicular sets could be connected to the single output connection of the electronic tone source and to the single input connection of a detector to enable scanning of both sets of channels.

Figure 4:
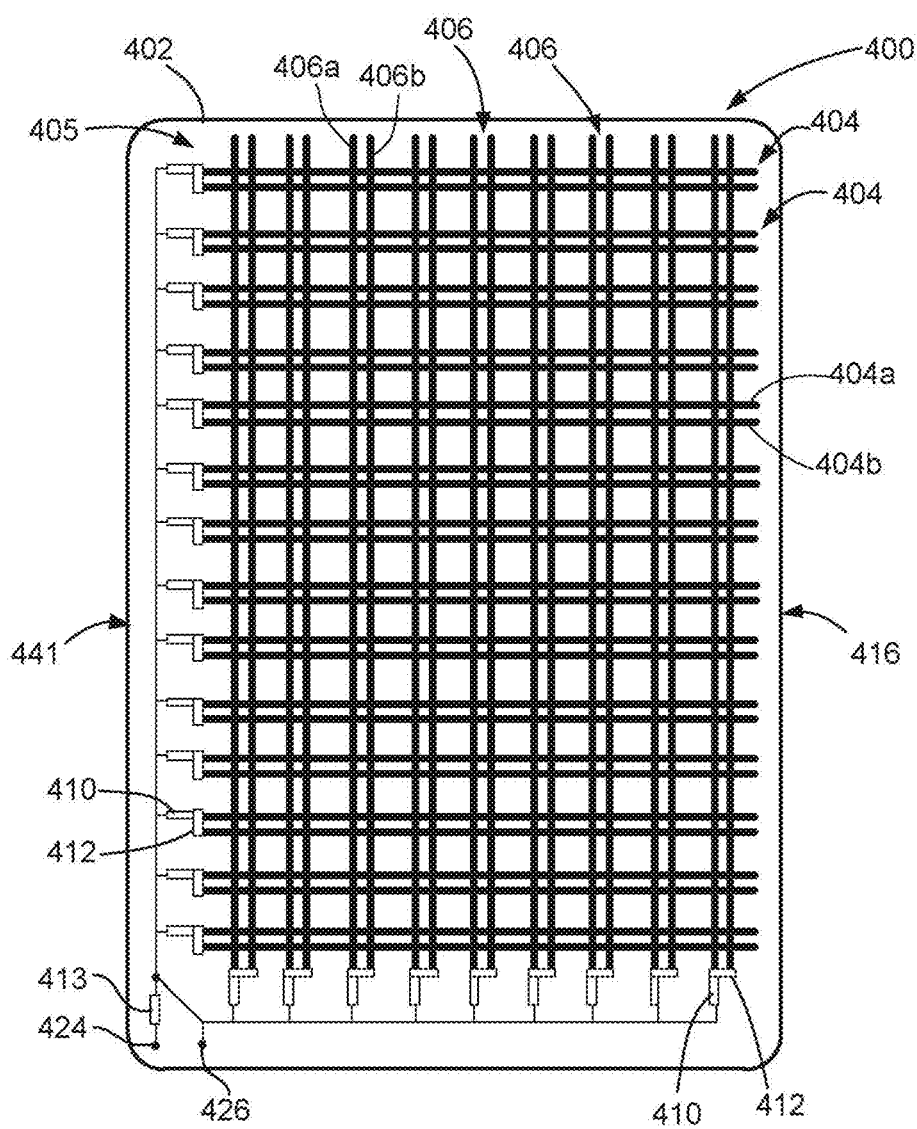
FIG. 4 is a top view of another example frequency multiplexing touch sensor apparatus.

FIG. 4 is a top view of a touch sensor apparatus 400 according to another embodiment. The touch sensor apparatus 400 may be part of a touchscreen, for example. The touch sensor apparatus 400 includes a substrate layer 402. Distributed on the substrate layer 402 are horizontal channels 404 and vertical channels 406. Each horizontal channel 404 is a resonant circuit including a respective capacitor 410 and inductor 412 connected to a pair of first and second horizontal electrode strips 404a and 404b in a manner similar to the channels 114a to 114j of FIG. 1. Each vertical channel 406 is a resonant circuit including a respective capacitor 410 and inductor 412 connected to a pair of first and second vertical electrode strips 406a and a 406b in a manner similar to the channels 114a to 114j of FIG. 1. A resistor 413 is also shown in FIG. 4 and is arranged similarly to the resistor R in FIG. 1.

Each channel 404 and 406 in FIG. 4 has a unique combination of capacitance and inductance values to provide a unique resonance frequency (similar to the capacitive touch circuit 100 in FIG. 1). The horizontal channels 404 and the vertical channels 406 are separated by an insulating layer (not shown). For example, the vertical channels 406 may be on a top face of a substrate layer, and the horizontal channels 404 may be on a bottom face of the substrate layer, or vice versa. Alternatively, the sets of horizontal and vertical channels 404 and 406 may be arranged on two different layers (not shown) that are stacked on one another. Alternatively, the sets of horizontal and vertical channels 404 and 406 may be arranged on the same substrate layers (not shown) with insulating material arranged to prevent direct contact. Any method of arranging a two dimensional array of touch sensitive channels on one or more substrate layers may be used.

The horizontal and vertical channels 404 and 406 are collectively connected to a single circuit input connection 424 and also collectively connected to a single circuit output connection 426 in this example. A controller (such as the controller 300 shown in FIG. 3) including a tunable signal generator and/or detector may be connected (e.g. using wires) to the touch circuit 400 via the circuit input connection 424 and the circuit output connection 426 to scan the channels 404 and 406. The touch sensor apparatus 400 may be integrated together with a controller within a single device housing (not shown). For example, the housing may be in the form of a protective tablet housing complete with gaskets and/or other seals to protect the touch sensor apparatus 400, as well as other parts of a tablet. The touch sensor apparatus 400 may typically include a transparent protective layer (not shown) such as glass or plastic covering the substrate layer 402 and the channels 404 and 406. In other embodiments, some or all of the controller circuitry (including the tunable signal generator and/or the detector) may be integrated in to the touch sensor apparatus 400 rather than included in a separate controller.

Each channel the 404 and 406 has a unique resonance frequency. Thus, by scanning each of the channels 404 and 406 (by cycling through the resonance frequencies and detecting changes in response when tuned to each frequency), touch may be registered in two dimensions.

Figure 6:
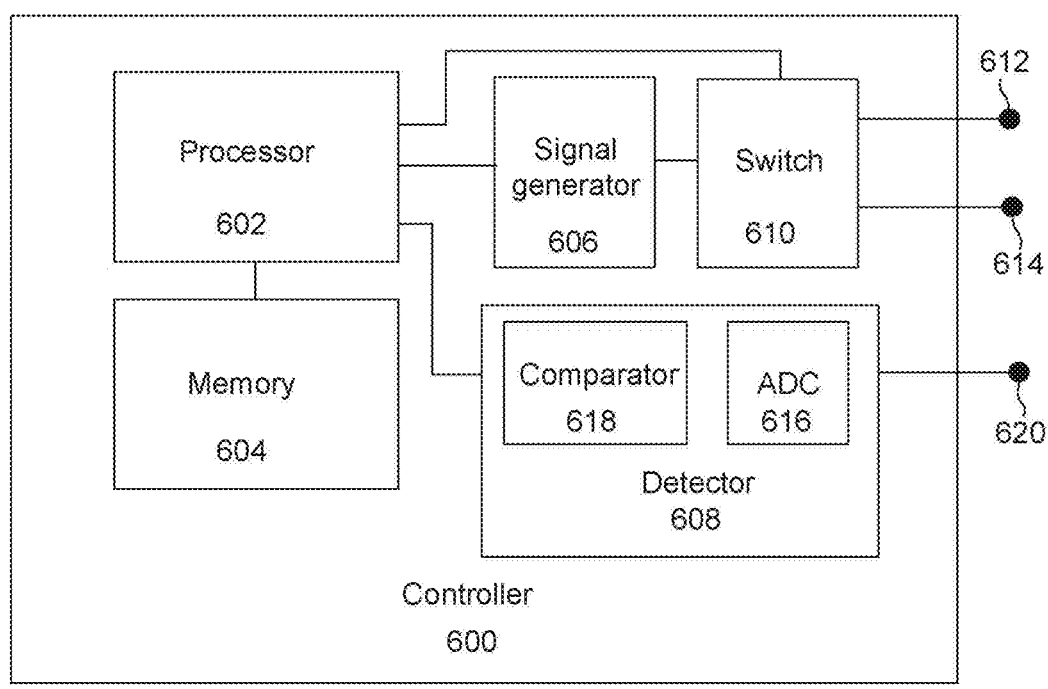
FIG. 6 is a block diagram of another example controller according to some embodiments.

A controller, such as the controller 600 shown in FIG. 6, may selectively excite the channels 404 and 406 in the touch sensor apparatus 400 and may detect touch events. For two dimensional sensing, the controller may detect a touch event on at least one horizontal channel 404 and at least one vertical channel 406.

A single touch may affect and be detected for multiple channels to varying degrees. For example, a touch on one channel may also be detected at the adjacent channel(s) to a lesser degree. A touch between two channels may affect those two channels in a similar manner. By measuring the degree of response for multiple channels, a controller may infer the location of a touch event, even though that touch event is not directly over a given single channel.

If a mutual capacitive touch sensor apparatus has ITO strips 1 cm wide each, and they cross each other at right angles, the capacitance of this two-layer structure at every intersection may be between 8.85 pF to 62 pF depending on the type and thickness of the dielectric substrate. This capacitance may be varied by changing the width of the strip or by adding areas on the periphery of the touch sensor apparatus. If more than two layers are used, this addition may take very little room on the side of the touch sensor apparatus, since the capacitance doubles, triples, etc. with each additional layer. For cost-effectiveness, it may be desirable to have only a single layer of dielectric substrate. In either case, to increase capacitance, the capacitance area may be increased. Thus, electrodes and/or fixed capacitor elements of resonant circuits with a desired capacitance may be created using planar conductors (e.g. ITO or metal) on a substrate layer.

In some embodiments, two or more sets of resonant circuits (channels) may share the same set of resonance frequencies (i.e. each resonant circuit in a set has a frequency that is unique within that set, but not unique outside of that set). Each set of resonant circuits may include a separate input connection (e.g. connected to a controller having a signal generator). Output from a single tuneable signal generator may be switched between inputs for the sets of resonant circuits to selectively excite sets of resonant circuits. For example, switching circuitry may be connected to the tuneable signal generator for selectively driving the sets of resonant circuits. Two or more sets of resonant circuits may include one or more common (i.e. same or substantially similar) resonance frequencies. In this manner, the total number of resonance frequencies used in a touch circuit device may be less than the total number of resonant circuits, but the number of connections (e.g. wires) needed to connect to the resonant circuits (i.e. channels) for scanning may still be significantly reduced in comparison to conventional touch sensor devices. Alternatively, two or more tuneable signal generators may be separately connected to excite two or more respective sets of resonant circuits. In still other embodiments, two or more signal generators may be used to excite separate sets of resonant circuits.

Figure 5:
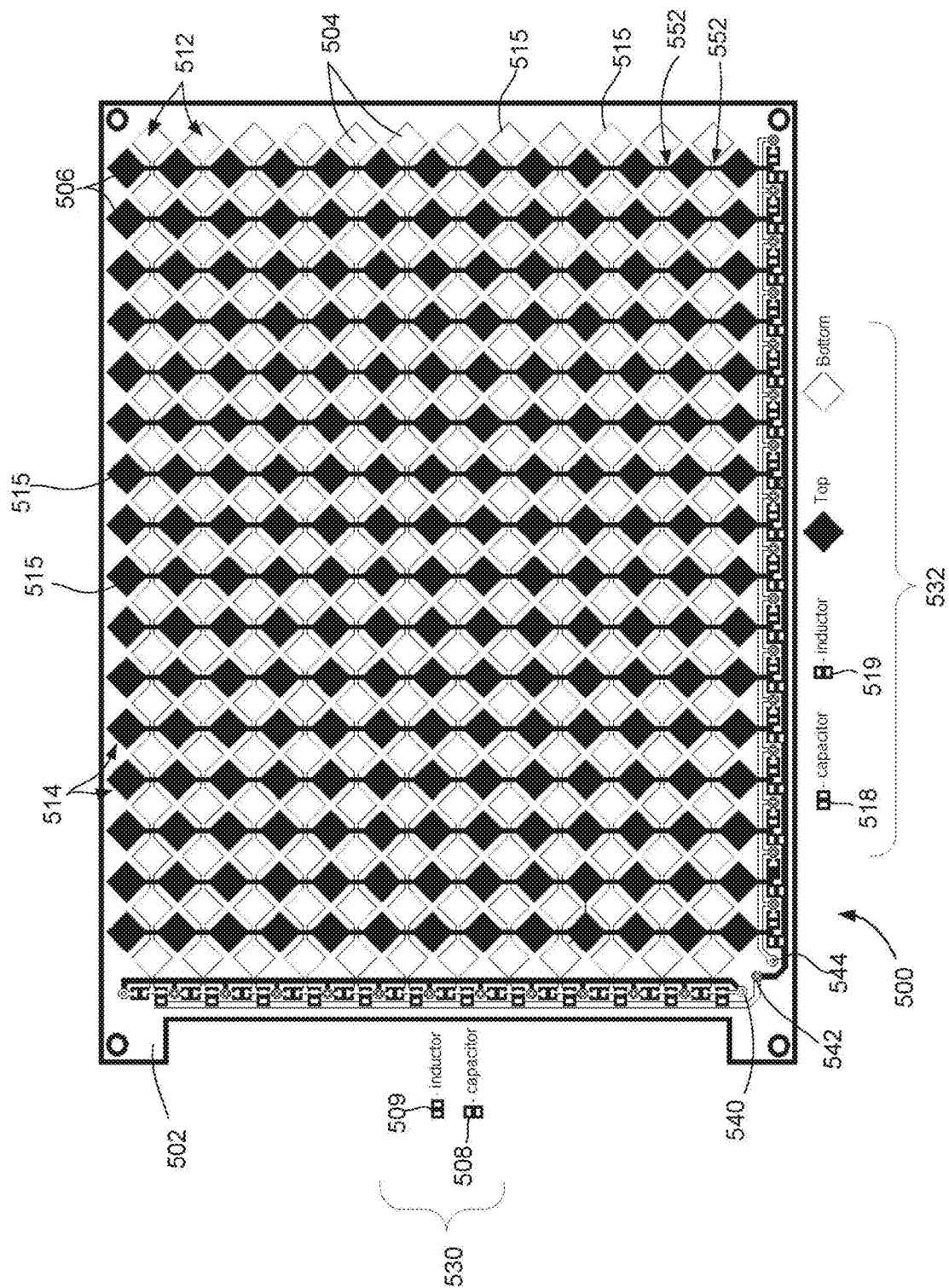
FIG. 5 is a top view of a layout for another example frequency multiplexing capacitive touch sensor apparatus.

FIG. 5 is a top view of a layout for an example capacitive touch sensor apparatus 500 of a touch sensor apparatus. The touch sensor apparatus 500 may part of a touchscreen, for example. The apparatus may be connected to or include a controller (such as the controller 300 of FIG. 3 or the controller 600 of FIG. 6) connected to the touch sensor apparatus 500. The touch sensor apparatus 500 includes conductor elements as discussed below printed, deposited or etched on a substrate 502. In non-transparent touchpad applications, the substrate 502 may, for example, be a Printed Circuit Board (PCB) substrate material including a top PCB layer and a bottom PCB layer (not shown) that underlays the top PCB layer. However, for transparent touchscreen applications, other substrate materials (such as transparent materials including glass or plastic) may alternatively be used. In some embodiments, the layers of the substrate may comprise different materials.

The capacitive touch sensor apparatus 500 in this embodiment includes horizontal (Y) electrodes 504 and vertical (X) electrodes 506 arranged on the substrate 502. The horizontal electrodes 504 are electrically separated from the vertical electrodes. For example, an insulating layer may be positioned between electrodes. The horizontal electrodes 504 may be arranged on a bottom surface of the top PCB layer of the substrate 502, and the vertical electrodes may be arranged on a top surface of the bottom PCB layer of the substrate 502, with an insulating layer therebetween. The insulating layer is provided between the horizontal and vertical electrodes 504 and 506. The insulating layer may be any suitable material that electrically insulates the electrodes. In other embodiments, a single substrate layer (e.g. PCB or a transparent substrate) may be used with horizontal electrodes on one face of the substrate layer, and vertical electrodes on the opposite face. Embodiments are not limited to any particular arrangement of multiple layers of electrodes and/or substrate layers.

Electrodes 504 and 506 are "sensing" electrodes. In other words, when a finger touches over any electrode pad 515 of electrodes 504 or 506, a capacitive path is added from that electrode to the touching body, which being a relatively large object has much larger capacitance to true ground. Ground electrodes (paired with the sensing electrodes) are not included in this embodiment.

The horizontal (Y) electrodes 504 are shown in white with a black outline, while the vertical (X) electrodes 506 are shown solid black in FIG. 5. This visual differentiation does not imply that the horizontal electrodes 504 are made of a different material than the vertical electrodes 506. Rather, the visual differentiation is simply to help visually distinguish the electrodes as being different conductor layers. The horizontal electrodes 504 and the vertical electrodes 506 may comprise the same material. For example, the electrodes 504/506 may comprise a metal conductor, such as, but not limited to, copper. In other embodiments, the electrodes may be made of a substantially transparent conductor such as, but not limited to, ITO or copper mesh. A protective top layer (not shown) of glass or plastic may cover the substrate layer and the conductive strips.

The touch sensor apparatus 500 in this example is a single plane pattern, meaning that the electrodes are arranged in substantially the same plane (with only a small separation).

Each of the horizontal electrodes 504 in this example embodiment are connected to a respective capacitor 508 and a respective inductor 509 to form a respective resonant circuit. Each of the vertical electrodes 506 in this example embodiment are connected to a respective capacitor 518 and a respective inductor 519 to form a respective resonant circuit. The resonant circuits including the horizontal electrodes 504 may be referred to as horizontal or Y "channels" 512, and the resonant circuits including the vertical electrodes 506 may be referred to as vertical or X "channels" 514. Each channel 512/514 is connected to a controller (not shown) that inputs electronic tone signals to the channels (including the vertical electrodes 504 and horizontal electrodes 506) and receives outputs from the channels. The controller processes the outputs to detect touch events. More particularly, the processor detects changes in the outputs from one or more channels 512/514. The change in output is due to a change in the resonance frequency of the one or more channels 512/514 caused by the capacitance change due to a finger or other object touching the touch sensor apparatus 500.

The capacitors 508 connected to the horizontal electrodes 504 are each indicated by the respective vertically arranged capacitor icon 508 shown in first legend section 530 of FIG. 5. The inductors 509 connected to the horizontal electrodes 504 are each indicated by the respective horizontally arranged inductor 509 shown in the first legend section 530. The capacitors 518 connected to the vertical electrodes 506 are each indicated by the respective horizontally arranged capacitor icon 518 shown in second legend section 532 of FIG. 5. The inductors 519 for the horizontal channels 512 are each indicated by the respective vertically arranged inductor icon 519 shown in the second legend section 532.

By way of example, the capacitors 508/518 may each have a capacitance in the range of 80 pF to 300 pF, and the inductors 509/519 may each have an inductance in the range of 2 μH to 50 μH, although embodiments are not limited to these ranges.

The horizontal channels 512 (including horizontal electrodes 504) are collectively connected to a first input/output connection 540 through inductors 509 and are collectively connected to ground 542 (with the corresponding capacitors 508 connected in series between the first input/output connection 540 and ground 542). The vertical channels 514 (including vertical electrodes 506) are collectively connected to a second input/output connection 544 through inductors 519 and are also collectively connected to ground 542 (with the corresponding capacitors 518 connected in series between the second input/output connection 544 and ground 542).

In this example, the capacitive touch sensor apparatus 500 is configured for frequency multiplexing, whereby each horizontal channel 512 has a unique resonance frequency (among the horizontal channels 512) and each vertical channel 514 has a unique resonance frequency (among the vertical channels 514). Thus, to scan the horizontal channels 512, a series of input signals are input collectively to all horizontal electrodes 504 cycling through the resonance frequencies of the horizontal channels 512. The controller processes the output for the cycling frequencies to detect changes caused by a touch event. Similar cycling input signals at or near the resonance frequencies of the vertical channels 514 are input to the vertical channels. The controller may include a tunable electronic tone signal generator to generate the series of input signals for the horizontal and vertical channels 512/514. Frequency multiplexing in this manner allows multiple channels to be connected to a single input/output connection, thereby reducing the number of connections required between the controller and the touch sensor apparatus 500. However, embodiments are not limited to frequency multiplexing touch panels. Aspects of the disclosure described herein may be applied in other configurations as well. For example, rather than frequency multiplexing, a capacitive touch screen may comprise channels that are individually connected to the controller to be selectively driven (at the same frequency).

The capacitors 508 and 518 and inductors 509 and 519 may all be located on a top surface 522 of the top PCB layer of the substrate 502 and connected through the top PCB layer and the bottom PCB layer (not shown) to the electrodes 504 and 506, respective first and second input/output connections 540 and 544 and ground 542 as needed. Other arrangements are also possible. Any suitable arrangement connecting circuit elements together into the layout shown in FIG. 5 may be used.

A touch event on the capacitive touch sensor apparatus 500 may register a change in capacitance for at least one horizontal electrode 504 and at least one vertical electrode 506, thereby enabling a determination of a position of the touch event in two dimensions.

As shown in FIG. 5, each of the vertical and horizontal electrodes 504 and 506 are in the form of elongated electrode strips formed by several spaced apart and interconnected diamond shaped pads 515. These pads 515 do not overlap. Rather, horizontal electrodes 504 overlap or crossover (but do not make contact with) the vertical electrodes 506 at narrow portions 552 of the electrodes 504 and 506 between adjacent pads 515. Interconnected pads that form an electrode strip are not limited to diamond shaped pads. Other shapes (e.g. circular) may be used. The example pads 515 in FIG. 5 may, for example, have widths in the range of approximately 4 mm to approximately 8 mm, although embodiments are not limited to this size range.

The electrodes 504 and 506 are not directly connected to a ground plane, and the capacitors 508 and 518 and inductors 509 and 519 do not overlap on the ground plane. Therefore, the electrodes 504 and 506 will "float" (in an electrical voltage sense) over the substrate 502. The horizontal and vertical electrodes 504 and 506 are connected to a physical ground via ground 542. However, it may be desirable to minimize the capacitance to the ground 542 to improve performance.

The touch of a finger provides a virtual ground through the human body. Thus, when a human finger is applied to the touch sensor apparatus 500, the measured amplitude response will increase due to the change in capacitance, despite the absence of the ground plane. In an experimental setting, the layout described above provided a response amplitude change of five to six percent from a touch event.

By way of non-limiting example, FIG. 6 is a block diagram of a controller 600 that may be connected to (or be part of) the touch sensor apparatus 500 shown in FIG. 5. In some embodiments, the controller 600 is part of the touch sensor apparatus 500. The controller 600 includes control circuitry comprising a processor 602 and a memory 604. As mentioned above, other control circuitry arrangements may also be used. The controller 600 further comprises a tuneable signal generator 606, a detector 608 and a switch 610. The memory 604 stores computer-executable code thereon for causing the processor 602 to perform functions described below. In other embodiments, the memory 604 may be incorporated as part of the processor 602, rather than external to the processor 602 as shown in FIG. 6. The processor 602 is also connected to communicate with the tuneable electronic tone signal generator 606, the detector 608, and the switch 610. The communication may include providing control signals to the tuneable electronic tone signal generator 606, the detector 608 and the switch 610, as well as receiving, as input, data output from the detector 608.

A first output terminal 612 of the controller 600 may be connected to the first input/output connection 540 for horizontal channels 512 of the touch sensor apparatus 500 of FIG. 5 to excite the horizontal channels 512. A second output terminal 614 of the controller 600 may be connected to the second input/output connection 544 for vertical channels 514 of the touch sensor apparatus 500 of FIG. 5 to excite the vertical channels 514.

Electronic tone signals generated by the tuneable electronic tone signal generator 606 are selectively output through the switch 610 to either a first output terminal 612 or a second output terminal 614 as directed by the processor 602. The tuneable electronic tone signal generator 606 in this example is capable of selectively generating signals (for input to the touch sensor apparatus 500) at (or near) each of the resonance frequencies of the horizontal and vertical channels 512 and 514 (shown in FIG. 5). The processor 602 controls the switch 610 and the tuneable electronic tone signal generator 606 to scan each of the horizontal and vertical channels 512 and 514. For example, the switch 610 may first be set to direct the electronic tone signals to the first output terminal 612 while the tuneable electronic tone signal generator 606 cycles through all of the resonance frequencies for the horizontal channels 512. Then the switch 610 may be set to direct the electronic tone signals to the second output terminal 614 terminal while the tuneable electronic tone signal generator 606 cycles through all of the resonance frequencies for the vertical channels 514. Other scanning sequences may also be used (including hopping sequences).

The detector 608 in this example includes an ADC 616 and a comparator 618. The detector 608 is connected to controller input terminal 620 to receive, as input, the response output from the touch sensor apparatus 500 (shown in FIG. 5). The controller input terminal 620 may also be connected to the first and second input/output connections 540 and 544 of the touch sensor apparatus 500 to measure the response of the horizontal and vertical channels 512 and 514 (shown in FIG. 5). The detector 608 receives analog output from the touch sensor apparatus 500 and first converts the analog signal to digital values using the ADC 616. The digital values are compared to expected response levels (e.g. expected response for no touch event) by the comparator 618. The comparison data from the comparator 618 is passed to the processor 602. Based on the output from the detector 608, the current state of the switch 610 and the current selected resonance frequency, the processor determines which of the horizontal channels 512 and which of the vertical channels 514 (shown in FIG. 5) are currently touched and to what extent.

The tuneable electronic tone signal generator 606 may include a synthesizer chip or circuit. The switch 610 of the controller 600 may include a PIN diode (not shown) that can divert the electronic tone signal from the tuneable electronic tone signal generator 606 to the first or second output terminals 612 and 614. The processor 602 (or possibly the switch 610) may include a switch driver control circuit that controls the PIN diode. The switch driver control circuit may turn the PIN diode on and off, for example, by applying a forward or reverse bias. The switch driver control circuit may use a low-pass filter between the electronic tone signal generator and the switch.

From a technological point of view, the available frequency band may be limited at the upper end by the 'skin effect' which causes reduced conductivity in any conductor at higher frequency. The lower end of the available frequency band may be limited by the "quality factor" or "Q" (of corresponding resonances) of typical inductors and/or a diminishing ability to discern the small capacitance change caused by a touch against a very large resonant capacitor value. Furthermore, government regulations may also limit the frequencies suitable for use in a touchscreen device.

Due to limitations on available bandwidth, it may be desirable for the individual resonances of the channels of the capacitive touch panel device to be quite narrow with a closer spacing therebetween, particularly in larger screens with a high number of channels. By narrowing the resonances, a higher number of resonance frequencies may be available, thereby increasing the size of the touch panel that may be created using the same overall frequency range. Furthermore, a touch screen may sense touch position(s) more precisely if the channels are narrower in physical width, with more channels total used over the same physical area. Thus, allowing a higher number of channels may also allow for a higher sensor resolution. However, resonator circuits based on discrete inductors may be limited by the "quality factor" of the inductors suitable for such resonance frequencies. Quality factor (Q) may be defined as the ratio of energy in an oscillation to the energy lost per cycle. Quality factor may also be (equivalently) defined as the inverse of the bandwidth of an oscillator (i.e. the range of drive frequencies over which the oscillator will oscillate at relatively elevated amplitude) relative to its center frequency.

According to an aspect, the resonant circuits of a capacitive touch sensor apparatus each include a respective electromechanical resonator, rather than a discrete inductor (LC) resonator circuit. The electromechanical resonators are each connected to the electrode of the corresponding resonant circuit.

Example electromechanical resonators may include, but are not limited to: ceramic resonators, crystal oscillators, microelectromechanical (MEMs) resonators, piezoelectric, Surface Acoustic Wave (SAW) resonators and the like. Electromechanical resonators may comprise a mechanical (mass) that functions as the inductance/inertial component of an inertia/spring/dampener resonance system, thereby forming an oscillator. Some ceramic resonators contain built-in capacitors and some do not. Either form of ceramic resonator may be suitable for use in embodiments described herein. Ceramic resonators with or without built-in capacitors may be used. In some embodiments, the selection of capacitance in external circuitry accommodates any built-in capacitance of the ceramic resonators.

Electromechanical resonators may be referred to as "distributed parameter" resonators because they do not include discrete inductor or capacitor elements to produce the resonance. The high quality factor (Q) and corresponding narrow bandwidth of both ceramic oscillators and crystals, for example, may enable more frequencies to be driven on a single feed into the touch screen without interfering with one another within a given overall bandwidth.

Ceramic oscillators may typically be the least expensive resonators listed above, and may have a sufficiently high Q needed for an effective touchscreen. Ceramic oscillators are widely manufactured with operating frequencies in the suitable range for various applications in sufficiently small form factors so they can be fitted within a fraction of an inch around the screen. Crystal oscillators, on the other hand, typically have a higher Q than ceramic oscillators and theoretically better functional performance, but crystal oscillators may be more expensive than ceramic oscillators and may not be readily available in many different, closely spaced frequency values. The example touch sensor apparatuses 500 and 704 of FIGS. 5 and 7 may be modified to include electromechanical resonators rather than the discrete inductor/capacitor resonant circuit components.

Figure 7:
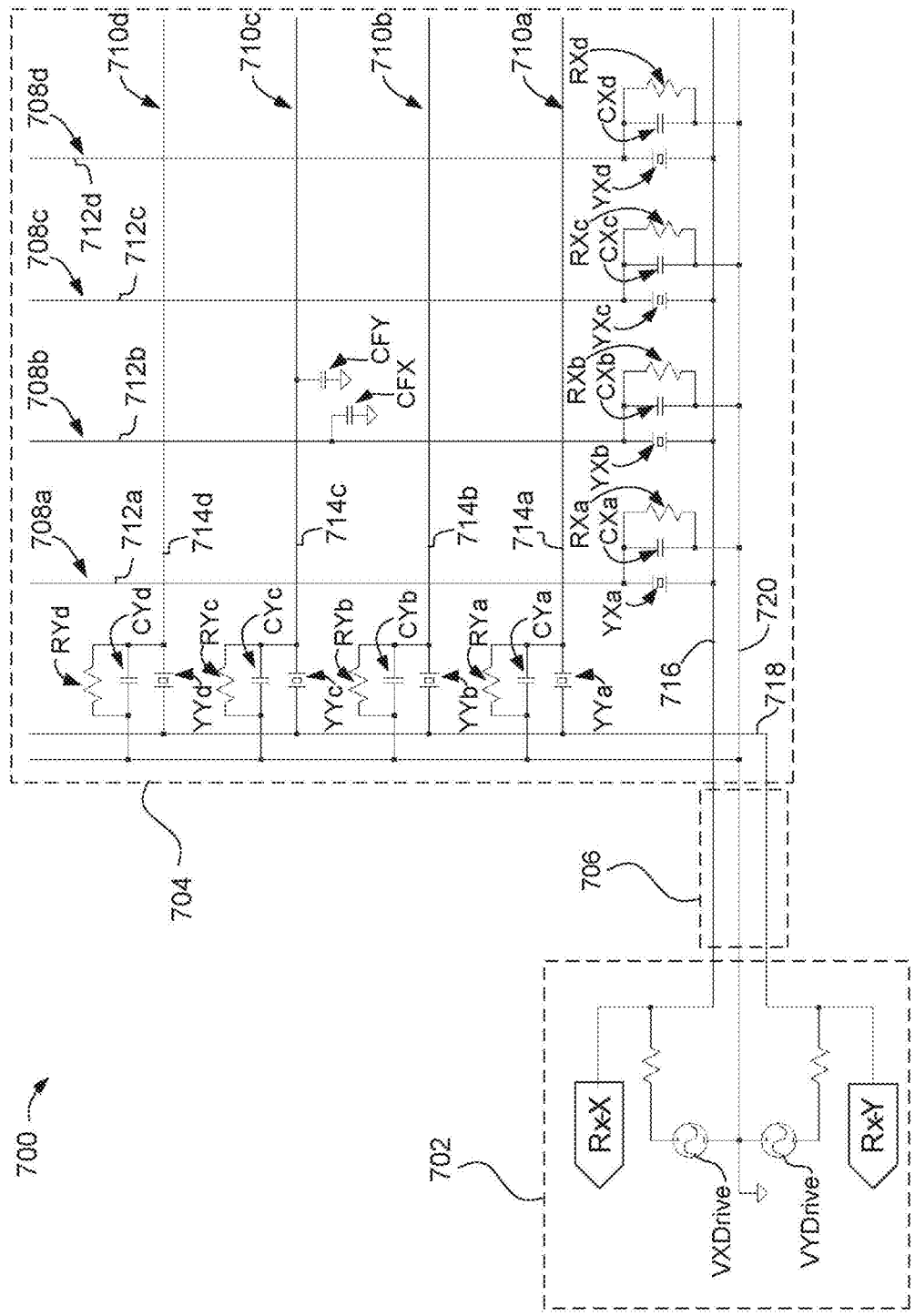
FIG. 7 is a schematic diagram of example capacitive touch sensor apparatus including electromechanical resonators according to some embodiments.

FIG. 7 is a schematic diagram of example capacitive touch sensor system 700. The system 700 includes controller 702 and touch sensor apparatus 704. The controller 702 and touch sensor apparatus 704 are connected by an electrical interconnect 706 in this example, which may be in the form of a flexible connection cable (i.e. flex interconnect), for example. The touch sensor apparatus 704 may be in the form of a touch sensor panel and may be part of a touchscreen, for example.

The touch sensor apparatus 704 includes a plurality of vertical or "X" channels 708a to 708d spaced along the X-axis, and a plurality of horizontal or "Y" channels 710a to 710d spaced along the Y-axis. Although only four X channels 708a to 708d and four Y channels 710a to 710d are shown for illustrative purpose, it is to be understood that embodiments are not limited to any particular number of channels. Typically, a touch sensor may comprise substantially more channels.

Each X channel 708a to 708d channel includes: a respective electrode (712a, 712b, 712c, or 712d) and a respective resonator (YXa, YXb, YXc, or YXd). Similarly, each Y channel 710a to 710d channel includes: a respective electrode (714a, 714b, 714c, or 714d) and a respective resonator (YYa, YYb, YYc, or YYd). Each X channel resonator (YXa to YXd) is connected between the corresponding electrode (712a to 712d) and an X channel input/output line 716. Each Y channel resonator (YYa to YYd) is connected between the corresponding electrode (714a to 714d) and a Y channel input/output line 718. The "X" electrodes (712a to 712d) and "Y" electrodes (714a to 714d) will typically be arranged on a substrate layer (not shown), possibly with protective top layer (not shown) of glass or plastic covering the substrate layer and the electrodes.

The resonators YXa to YXb and YYa to YYb are electromechanical resonators in this embodiment. More specifically, the resonators YXa to YXb and YYa to YYb in FIG. 7 do not comprise discrete inductor and capacitor elements. Example electromechanical resonators include, but are not limited to: crystal oscillators; ceramic oscillators; tunable or fixed microelectromechanical system (MEMS) oscillators; piezoelectric; and Surface Acoustic Wave (SAW) resonators. Such electromechanical resonators may have significantly higher Q factors than discrete-element LC resonator circuits and may be referred to as "high Q" resonators. As a result, the X channels 708a to 708d and Y channels 710a to 710d may have narrower resonances than discrete-element LC resonator circuits.

For each resonant circuit, the corresponding electromechanical resonator (YXa to YXb and YYa to YYb) essentially forms part of an "electronic frequency filter," or, more specifically, a "narrowband electronic frequency filter" or "resonant narrowband electronic frequency filter". That is, each resonant circuit acts a as a narrowband frequency filter in that it responds only when addressed by an appropriate frequency input.

In some embodiments, the resonators YXa to YXb and YYa to YYd are selected to have resonance frequencies between about 2 MHz and about 30 MHz. In some embodiments, the resonance frequencies are between about 4 MHz and about 12 MHz. As discussed above, in some embodiments, each resonator YXa to YXd and YYa to YYd may have a unique resonance frequency for frequency-multiplexing. In other embodiments, the resonance frequencies of the X channels may overlap with the resonance frequencies of the Y channels. For example, each X channel resonator YXa to YXd may have a first set of unique resonance frequencies, and the Y channel resonators YYa to YYd may have the same set of resonance frequencies. Each row resonator has a different resonance frequency. In some embodiments (e.g. for very large screens with many channels) each of the X-axis and the Y-axis channels could be split ('ganged') into electrically separate sections so crystals frequencies can be repeated. By way of example, a set of crystal resonators used on one axis may have the following resonance frequencies: 5.00 MHz; 5.12 MHz; 5.32 MHz; and 5.45 MHz, approximately. In-circuit resonance frequencies for channels using these resonators may be approximately 4.94, 5.06, 5.28 and 5.42 MHz respectively. In some embodiments, the spacing between adjacent resonances is at least 80 kHz. Embodiments are not limited to such frequencies or spacing.

The minimum spacing between two resonance frequencies may be a function of a resonators center frequency (termed the "resonance frequency" for the resonator) and the resonator's Q factor. By way of example, the minimum spacing between the resonance frequencies of first and second resonators (e.g. the frequency spacing between two adjacent X or Y channels in the frequency domain) may be eight times the first resonator's center frequency divided by the first resonator's Q factor.

In some embodiments, the Q factor of each electromechanical resonator is at least 200. In some embodiments, the Q factor is at least 800. As a more specific example, a ceramic oscillator with a resonance frequency of 4 Mhz may typically have a Q-factor in the neighborhood of 900. Thus, a minimum resonance frequency spacing may be about 50 kHz for this Q factor. A greater spacing may be recommended. In some embodiments, the spacing may be at least 40 kHz. The upper range of the spacing may be in the single digit MHz range, although embodiments are not limited to a particular spacing or range.

The Q factor is at least 10000 in some embodiments. For example, crystal oscillators may have very high Q factors, possibly in the range of 20000 to 200000. Thus, crystal oscillators may be particularly suited for use where a high number of closely spaced frequencies are desired.

With very high quality factors (e.g. 2000 or more), it may be difficult to tune a frequency synthesizer precisely enough to drive the oscillator at its very narrow resonance frequency. Also, the resonance frequency shift caused by a small touch event capacitance change may shift the very narrow (in frequency) resonance completely away from the frequency being used to drive and sense the touch. Such dramatic changes may make it difficult to determine the extent of a touch. Thus, in some cases, it may be beneficial to dampen the resonance of very high Q resonators with a resistor.

A damping resistor may be placed in series with the resonator and may absorb some energy each cycle of the oscillation, thereby reducing the quality factor and broadening the bandwidth of the resonance. By way of example, a typical 11.86 MHz quartz crystal may have a quality factor of 150000, an "equivalent capacitance" of 12 fF and an "equivalent inductance" of 15 mH. The "equivalent series resistance" of an oscillator with these qualities may be about 7.45 Ohms. Since quality factor (Q) is inversely proportional to resistance in a series resonant circuit, reducing quality factor to a more manageable level of 1000, for example, may be accomplished by adding about 1100 Ohms of external series resistance.

By contrast, a discrete-element LC resonator in the same frequency range may have a Q of 150 or less. The Q factor in discrete LC circuits may be limited by the inductor resistance.

Tunable resonators may allow management of interference detected at a specific frequency. For example, the resonators (YXa to YXb and YYa to YYd) may be tunable MEMs resonators. The resulting resonant circuits may, then, function as tunable resonant filters. Such tunable resonant filters may be used to reduce or avoid narrowband interference. For example, if narrowband interference is detected at or near the resonance frequency of a channel, that resonance frequency may be tuned to a different frequency (by adjusting the frequency of the resonator). If an erroneous response signal is detected from one (or more) resonant circuits due to electronic interference/noise that has frequency content within the narrow band (or bands), tunable MEMs devices of the affected resonant circuits could be programmed or retuned to operate at different frequencies until the interference is no longer detected. As another example, all resonance frequencies may be shifted (tuned) together to avoid or reduce such interference, or at least shift the effect of the interference onto a different channel so intelligent measurement filtering could determine the touch state of all channels. MEMs resonators may have a Q factor in the range of 20000 to 100000, for example.

The electrodes 712a to 712d and 714a to 714d are represented by lines or strips in FIG. 7, but they may be in the form of interconnected pads similar to the example of FIG. 5. Embodiments of the disclosure are not limited to any particular electrode form. Embodiments are also not limited to either mutual or self-capacitance configurations. Electromechanical resonators may be used in either type of capacitance touch sensor.

Turning again to FIG. 7, each channel (i.e. resonant circuit) optionally further comprises a respective resonator pulling capacitor. More specifically, each X channel 708a to 708d includes a respective pulling capacitor CXa, CXb, CXc or CXd, and each Y channel 710a to 710d also includes a respective pulling capacitor CYa, CYb, CYc or CYd. Each pulling capacitor (CXa to CXd and CYa to CYd) is connected between the corresponding electrode (712a to 712d and 714a to 714d) and ground 720 in this embodiment. The pulling capacitors (CXa to CXd and CYa to CYd) may each be a relatively small capacitor value to pull the corresponding resonator slightly away from its peak resonance, thereby making further smaller capacitance changes (caused by a finger) have a more dramatic impact on the output signal change. The pulling capacitors may also improve stability of the system. However, the pulling capacitors (CXa to CXd and CYa to CYd) may be omitted in other embodiments. The pulling capacitors may also be referred to as "parallel" capacitors because they are essentially in parallel with the corresponding resonators.

By way of example, the pulling capacitors (CXa to CXd and CYa to CYd) may have capacitances in the range of 12 pF to 30 pF. For example, using a pulling capacitor of approximately 22 pF, low frequency oscillators around 4 MHz might shift about 30 Hz down in frequency. Mid frequency oscillators around 6 MHz might shift 50 Hz down. Higher frequency oscillators around 9 MHz might shift about 100 Hz down when pulled.

The resonance frequency of a resonant circuit using an electromechanical resonator may depend on an added external capacitance (e.g. a "pulling capacitor" connected in parallel with the resonator). In some embodiments, two or more of the resonators with the same specifications may be used with different external capacitances to provide distinct resonance frequencies. In other words, more than one distinct frequency channel using the same "base" resonator or crystal frequency value may be achieved by loading the resonators with sufficiently different external capacitance values Each channel (i.e. resonant circuit) optionally further comprises a respective static discharge resistor. More specifically, each X channel 708a to 708d includes a respective static discharge resistor RXa, RXb, RXc or RXd, and each Y channel 710a to 710d also includes a respective static discharge resistor RYa, RYb, RYc or RYd. In this embodiment, each static discharge resistor (RXa to RXd and RYa to RYd) is connected between the corresponding electrode (712a to 712b and 714a to 714d) and ground 720, parallel to the corresponding pulling capacitor (CXa to CXd and CYa to CYd). By way of example, the static discharge resistors (RXa to RXd and RYa to RYd) may each have a resistance in the range of 0.5 to 5 MOhm. In some embodiments, the resistance is about 2 MOhms. These high resistances may allow static to be dissipated as quickly as it builds up but without functionally affecting the circuit in any other way. Preventing the buildup of significant static charge may help keep a ceramic resonator stable (i.e. stable resonance frequency).

The resonators (YXa to YXb and YYa to YYd), pulling capacitors (CXa to CXd and CYa to CYd) and discharge resistors (RXa to RXd and RYa to RYd) may be arranged in the bezel area of a touch screen device including the apparatus of FIG. 7.

Static electricity may negatively affect resonant circuitry in a capacitive touch sensor device. Static electric fields may be built up on glass cover layers, for example, and such static may slightly alter the properties of the resonant circuits. For example, in ceramic oscillator embodiments, static in the ceramic oscillator material within the ceramic oscillator may cause the circuitry to register false contacts or contact over too large an area. In some embodiments, a small conductance may be used to drain away static electrical charge before it can build up on conductors leading to the ceramic oscillators. This conductance may be in the form of a high value resistor connected to the resonant circuit of each channels/electrodes (between the resonating electrode and ground).

In FIG. 7, the static discharge resistors (RXa to RXd and RYa to RYd) have a high resistance to perform this function. The large resistance may be too large to have any noticeable or significant effect on circuit behaviour other than the desired prevention of the buildup of static charge. The static discharge resistors (RXa to RXd and RYa to RYd) may, for example, prevent the buildup of tens of volts of static charge before it occurs (at which level unwanted resonator performance changes may start to occur). Static discharge resistors (RXa to RXd and RYa to RYd in FIG. 7) may be used for various electromechanical resonator types, such as ceramic or crystal resonator.

In FIG. 7, an example touch event is shown by the capacitance CFX and CFY present due to a finger touch near the crossover point of channels 708b and 710c.

The controller 702 in this embodiment comprises an X channel tuneable drive oscillator (VXDrive). The X channel drive oscillator (VXDrive) is configurable to generate signals to scan through the resonance frequencies of the resonators by driving the X channels 708a to 708d through the frequencies of the resonators YXa, YXb, YXc and YXd. The drive oscillator (VXDrive) may be the same category of oscillator as the resonators YXa to YXd. For example, if the resonators YXa to YXd are crystal oscillators, then the drive oscillator may comprise a tunable crystal oscillator. Embodiments are not limited to a particular type of signal generator (or generators).

The output from the X channels 708a to 708d is collectively input to the controller as signal Rx-X that is received, as input, by the controller 702. The controller may further include a detector, and the signal Rx-X may be input to the detector when the X channels 708a to 708d are being scanned. The detector may be in the form of the detector 608 in FIG. 6, or the combined ADC 916 and Power Detector 917 of the controller 900 of FIG. 9. The controller 702 may further include a processor and memory. The processor may control the drive oscillator (VXDrive).

The controller 702 in this embodiment further comprises a Y channel tuneable drive oscillator (VYDrive). The Y channel drive oscillator (VYDrive) is configurable to generate signals to scan through the resonance frequencies of the resonators by driving the Y channels 710a to 710d through the frequencies of the corresponding resonators YYa, YYb, YYc and YYd.

The output from the Y channels 710a to 710d is collectively output as signal Rx-Y that is received, as input, by the controller 702. As mentioned above, the controller 702 may further comprise a detector. The signal Rx-Y may be input to the detector when the Y channels 710a to 710d are being scanned. The controller 702 may further include the processor and memory, as noted above, where the processor controls the Y-channel drive oscillator (VYDrive).

The example touch circuit configurations of FIGS. 1, 4 and 5 may be modified to replace the discrete-element LC resonator circuit components with electromechanical resonators similar to those shown in FIG. 7 and discussed above.

In some embodiments, the resonators may comprise a combination of different types of resonators. For example, a first set of resonant circuits (e.g. X channels) may comprise ceramic oscillators, and a second set of resonant circuits (e.g. Y channels) may comprise crystal oscillators. In such a case, the controller may (or may not) comprise two electronic tone signal generators, one to drive each set of resonant circuits.

Figure 8:
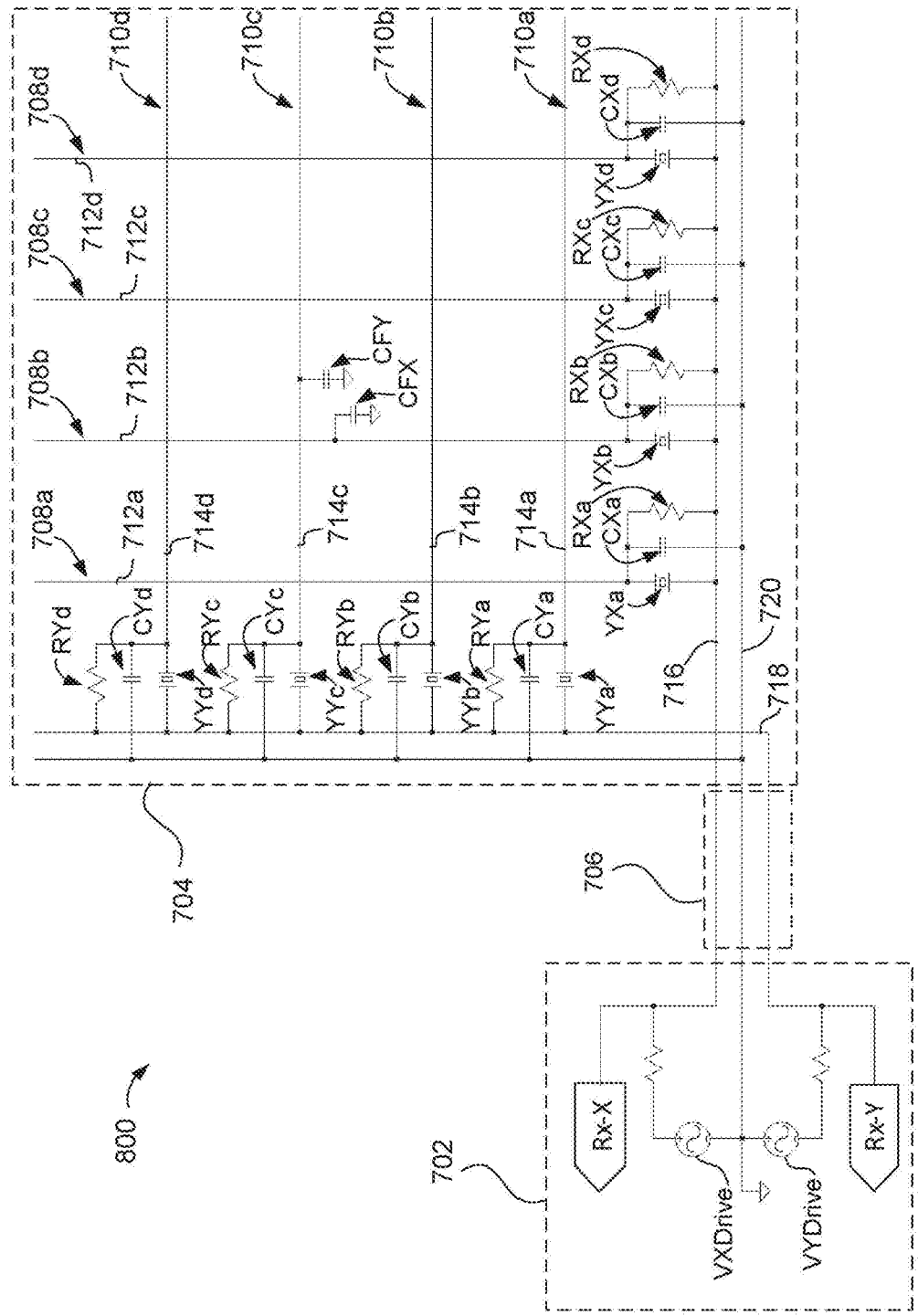
FIG. 8 is a schematic diagram of another example capacitive touch sensor apparatus including electromechanical resonators according to some embodiments.

The electrical equivalent circuit of a crystal or ceramic oscillator includes an inductor parameter, typically in order of mH's, which may be several orders of magnitude larger than can be practically deployed on a screen edge in the form of a discrete inductor element. For a given resonance frequency, crystals and ceramic oscillators (and other electromechanical resonators) have a correspondingly smaller tuning capacitance. The detuning effect of a finger when present is approximately proportional to the change in finger capacitance relative to the total fixed capacitance from the resonating circuit and other couplings such as crossover tracks. As such using a crystal or ceramic oscillator may greatly improve touch sensor sensitivity. FIG. 8 is a schematic diagram of another example capacitive touch sensor system 800 according to some embodiments. The touch sensor system 800 is essentially a modified version of the system 700 in FIG. 7 with similar or same elements shown with the same reference numbers. Only the differences or modifications of the system 800 will be described in detail below.

In FIG. 8 the X channel discharge resistors (RXa to RXd) are each connected to the X channel input/output line 716 (which is driven by VXDrive) rather than to ground 720. Similarly, the Y channel discharge resistors (RYa to RYd) are each connected to the Y channel input/output line 718 (which is driven by VYDrive) rather than to ground 720.

Crystals and ceramic oscillators may have very similar behavior. Crystals may have a slightly higher Q than ceramic oscillators, but both ceramic and crystal oscillators may be substantially improved over resonant circuits comprising discrete LC components (which may be referred to as an LC tank circuit). Circuit-wise, ceramic and crystal oscillators have primary resonances (similar to LC tank circuit), but a primary difference is that ceramic and crystal oscillators typically have much higher inductance values. For example, a crystal or ceramic oscillator may have an inductance in the mH range, whereas a discrete inductor with a similar value would be too large to be practical. Crystal and ceramic oscillators also typically have small capacitance. As a result, the resonant circuit may have less constant capacitance (including cross over capacitances etc.). Thus, finger capacitance may constitute a larger percentage of overall capacitance of the circuit, which may in turn provide a larger detuning effect. Also, due to the very high Q of ceramic and crystal oscillators, slight tuning to the side of the resonance frequency causes attenuation to drop very dramatically in the present of a finger.

In FIGS. 7 and 8, the electrode (712a to 712d and 714a to 714d) are "sensing" electrodes, and the drive signals (e.g. filtered by the oscillators of VXDrive and VYDrive) are sent over the electrodes. In some embodiments, optional "ground" electrodes may be included between the "sensing" electrodes, similar to the embodiment shown in FIGS. 1 and 4.

Embodiments are not limited to the use of electromechanical resonators utilized specifically with frequency-multiplexed capacitive touch sensor devices. Electromechanical resonators may also be utilized in time-multiplexed capacitive touch sensor devices using only one or a limited number of resonance frequencies. For example, the narrower resonances may give channels improved signal to noise ratio therefore making them able to be more sensitive to touch events.

Figure 9:
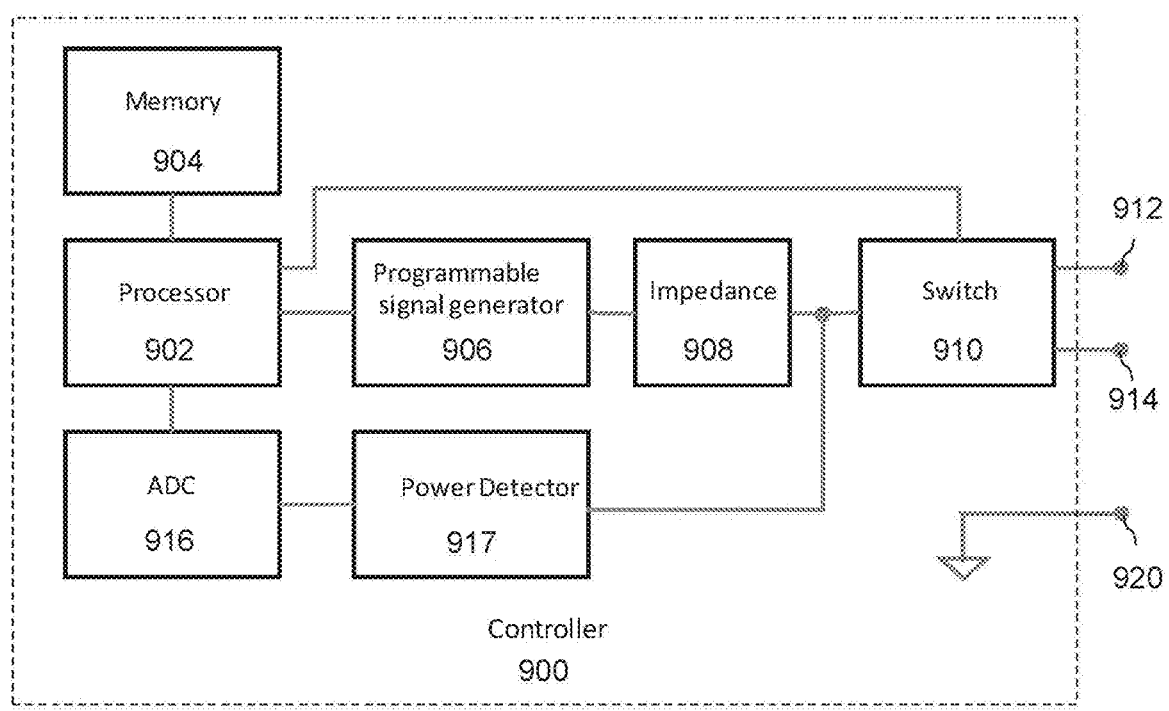
FIG. 9 is a block diagram of another example controller according to some embodiments.

FIG. 9 is a block diagram of a controller 900 according to another embodiment. The controller 900 that may be connected to (or be part of) a frequency multiplexed touch sensor apparatus, such as the touch sensor apparatuses 500 and 704 shown in FIGS. 5, 7 and 8). In some embodiments, the controller 900 is part of the touch sensor apparatus. As mentioned above, other control circuitry arrangements may also be used.

The controller 900 in this example includes control circuitry comprising a processor 902 and a memory 904. The controller 900 further comprises a signal generator 906, an optional impedance 908, a switch 910, and ADC 916, and a power detector 917. The memory 904 stores computer-executable code thereon for causing the processor 902 to perform functions described below. In other embodiments, the memory 904 may be incorporated as part of the processor 902, rather than external to the processor 902 as shown in FIG. 9. The signal generator 906 is a programmable electronic tone signal generator in this embodiment. However, any one or more signal generators capable of generating output signals at or near the resonance frequencies of a touch sensor apparatus may be used.

The ADC 916, and a power detector 917 may collectively be referred to as a "detector". Detectors are not limited to the ACD 916 and power detector 917 shown in this example. Other circuitry capable of detecting output signal levels may be used.

The switch 910 may be omitted in some embodiments. For example, if the touch sensor apparatus only has one set of channels (as opposed to two sets with overlapping resonance frequencies), and only one input/output terminal is included accordingly, the switch 910 may be omitted. Similarly, a separate signal generator may be included for each set of channels (each connected to a respective input/output terminal), in which case the switch 910 may also be omitted. Other configurations are also possible.

The processor 902 is also connected to communicate with the programmable electronic tone signal generator 906, power detector 917 (via the ADC 916), and the switch 910. The communication may include providing control signals to the programmable electronic tone signal generator 906, the power detector 917 and the switch 910, as well as receiving, as input, data output from the power detector 917 (via the ADC). Ground connection 920 is also shown.

A first output terminal 912 of the controller 900 may, for example, be connected to a first input/output connection (e.g. 540 in FIG. 5 or Y input/output line 718 of FIGS. 7 and 8) to excite horizontal (Y) channels. A second output terminal 914 of the controller 900 may, for example, be connected to the second input/output connection (e.g. 544 in FIG. 5 or X input/output line 716 of FIGS. 7 and 8) to excite the vertical (X) channels.

Electronic tone signals generated by the tuneable electronic tone signal generator 906 are selectively output through the switch 910 to either the first output terminal 912 or the second output terminal 914 as directed by the processor 902. The tuneable electronic tone signal generator 906 in this example is capable of selectively generating signals at each of the resonance frequencies of the row and column channels. The processor 902 may control the switch 910 and the tuneable electronic tone signal generator 906 to scan each of the channels. The electronic tone signal generator 906 may be programmable to output electronic tone signals between 4 MHz and 12 MHz, for example.

The power detector 917 in this example is connected to the ADC 916, which is in turn connected to the processor 902. The power detector 917 is connected to the switch 910 to receive, as input, the response output from the touch sensor apparatus (for example, via the first and second input/output connections 540 and 544 of the touch sensor apparatus 500). The power detector 917 measures the amplitude of the response of the row and column channels. The power detector 917 receives analog output from the touch sensor apparatus which is converted to digital values using the ADC 916. The digital values are compared to expected response levels (e.g. expected response for no touch event) by the processor 902. Based on the output, the current state of the switch 910 and the current selected resonance frequency, the processor 902 determines which of the row and column channels is currently touched.

Figure 10:
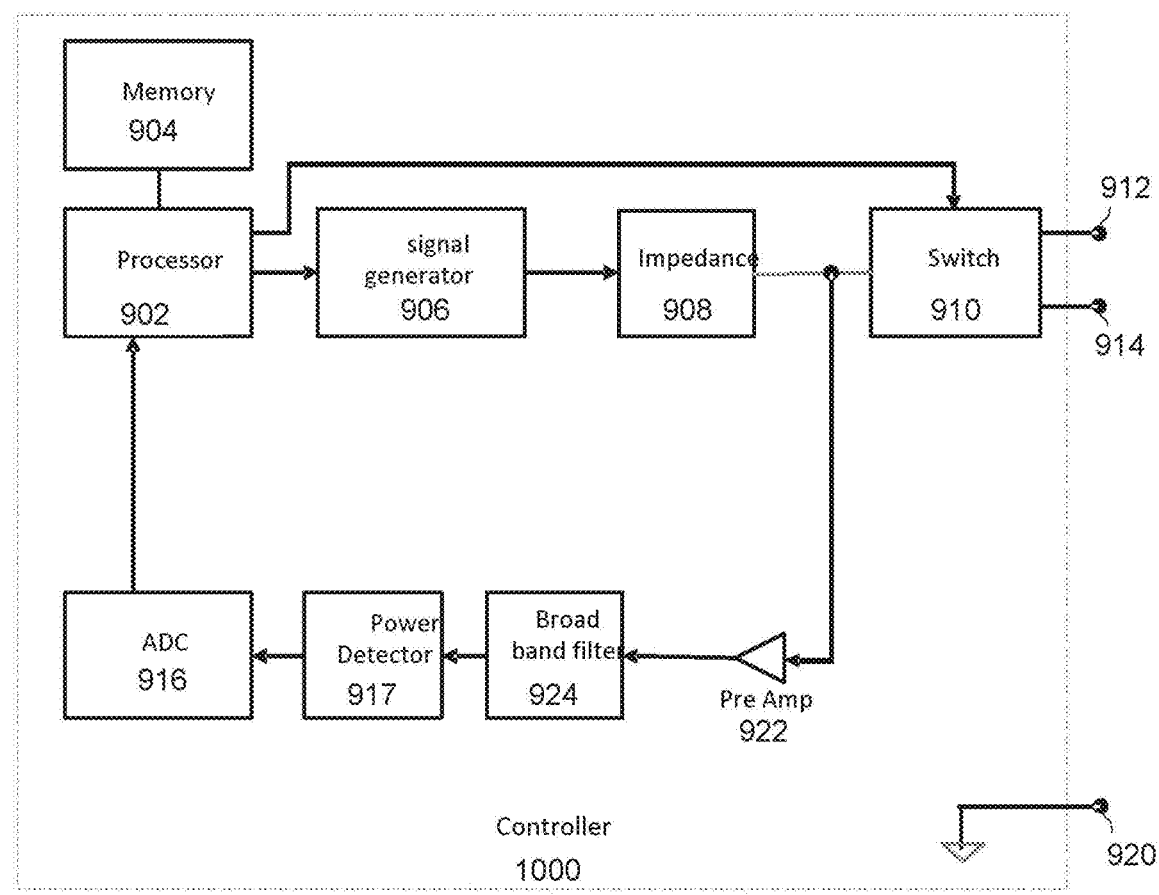
FIG. 10 is a block diagram of another example controller according to some embodiments.

FIG. 10 is a block diagram of a controller 1000 according to another embodiment. The controller 1000 is similar to the controller 900 of FIG. 9, and like reference numbers are used to refer to like elements from FIGS. 9 and 10. The description of FIG. 10 will focus on differences with respect to the controller 900. The controller 1000 may be connected to control a frequency multiplexed touch sensor apparatus (such as the touch sensor apparatuses 500 and 704 shown in FIGS. 5, 8 and 9). As mentioned above, other control circuitry arrangements may also be used.

Similar to the controller 900 of FIG. 9, the controller 1000 of FIG. 10 comprises a processor 902 and a memory 904. The controller 900 further comprises a programmable electronic tone signal generator 906, an impedance 908, a switch 910, and ADC 916, an power detector 917, first and second output terminals 912 and 914, and ground 920 (in a similar arrangement). The controller 1000 of FIG. 10 further includes a preamp 922 and a broadband filter 924 connected in series between the switch 910 and the power detector 917.

The passband of the broadband filter 924 may span all resonator frequencies used in the capacitive touch sensor connected to the terminals 912 and 914. For example, the broadband filter 924 may be several MHz wide to account for the different resonance frequencies in a frequency-multiplexed touch sensor configuration. For example, the passband of the broadband filter may cover from around 3 MHz to 13 MHz (i.e. having a bandwidth around 10 MHz). Noise in the signals received from the touch sensor (not shown) though terminals 912 and 914 may be proportional to the broad band filter width. Any single frequency electromagnetic interference (EMI), that is picked up on the electrodes of the touch sensor and aligns with any of the resonator frequencies of the touch sensor channels may affect the power level detected by the power detector 917. A broad range of electronic noise frequencies may be picked up on the interconnect cables may affect the power level detected.

The preamp 922 and broadband filter 924 may reduce the noise present in the signals processed by the power detector 917. The gain levels of the preamp 922 may be adjusted so mixer does not overload under worst case EMI.

In some embodiments, interpolating horizontal finger location between adjacent X electrodes and interpolating vertical finger location between adjacent Y electrodes may be implemented to provide a finer touch location resolution. The interpolation may include interpolating between the resonance frequencies of the X and Y channels.

Figure 11:
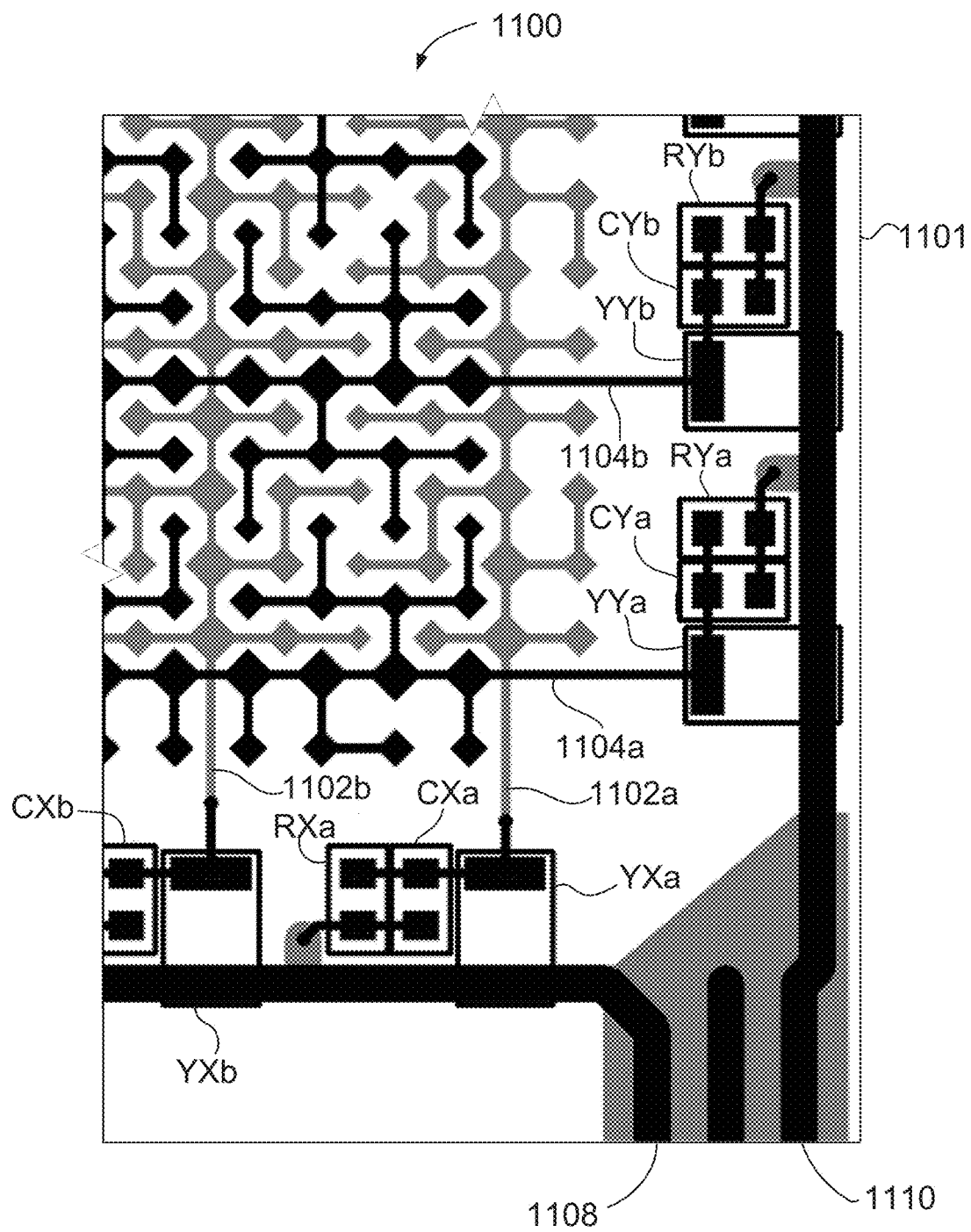
FIG. 11 is a top plan partial view of an example touch sensor apparatus according to some embodiments.

FIG. 11 is a top plan partial view of an example touch sensor apparatus 1100. The apparatus 1100 is in the form of a panel and comprises a substrate 1101 and with electrodes arranged thereon. Only a portion of the apparatus 1100 is shown, including X electrodes 1102a to 1102b and Y electrodes 1104a to 1104b. In this example, each of the X electrodes 1102a to 1102b is connected to a respective capacitance element (CXa or CXb), a respective resonance element (YXa or YXb) and a respective resistance element (RXa or RXb) to form a resonant circuit. Each resonant circuit for the X electrodes 1102a to 1102b has a unique resonance frequency, so that frequency multiplexing may be used to scan the electrodes. The X electrodes are collectively connected to a first input/output connection 1108 that may be driven with signals at or near the resonance frequencies to scan the X electrodes.

Similarly, each of the Y electrodes 1104a to 1104b is connected to a respective capacitance element (CYa or CYb), resonance element (YYa or YYb) and resistance element (RYa or RYb) to form a resonant circuit. Each resonant circuit for the Y electrodes 1104a to 1104b has a unique resonance frequency, so that frequency multiplexing may be used to scan the electrodes. The Y electrodes are collectively connected to a second input/output connection 1110 that may be driven with signals at or near the resonance frequencies to scan the Y electrodes.

Figure 12:
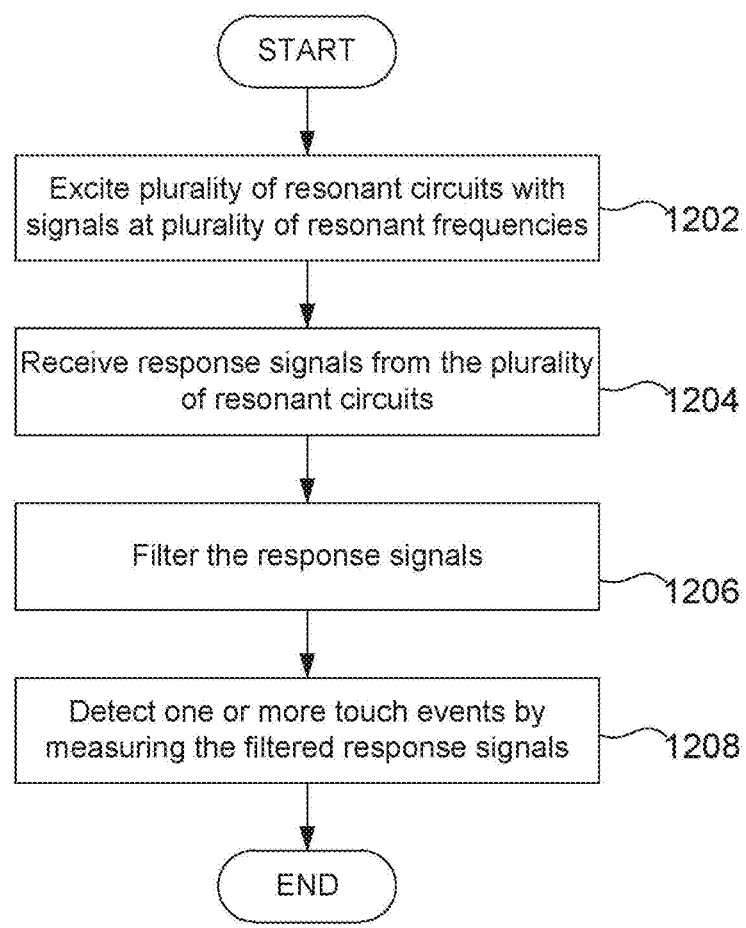
FIG. 12 is a flowchart of a method according to some embodiments.

FIG. 12 is a flowchart of a method according to some embodiments. The method may be performed by a capacitive touch sensor system as described herein comprising a plurality of resonant circuits having a plurality of resonance frequencies. Each of the resonant circuits may comprise an electromechanical resonator as described herein. The system may include a frequency multiplexing touch sensor apparatus (e.g. as shown in FIG. 1, 4, 5, 7, or 8) and one or more components of a touch sensor controller described herein (e.g. as shown in FIG. 10).

At block 1202, the plurality of resonant circuits is excited with signals at or near the plurality of resonance frequencies. The method may further comprise generating the signals with one or more signal generators (e.g. tunable and/or programmable signal generators). The one or more signal generators may be part of the controller of the capacitive touch sensor system.

At block 1204, response signals from the plurality of resonant circuits are received. The response signals are the signals output from the resonant circuits. The response signals may be received by the controller.

At block 1206, the response signals are filtered by a broadband filter. The broadband filter may have a passband that encompasses the set of resonance frequencies, but filters noise in the response signals at frequencies above or below that bandwidth. The broadband filter may comprise a plurality of filter components (e.g. low pass and high pass filter components). Any suitable filter configuration may be used.

Optionally, prior to block 1206, the method may further comprise amplifying the received response signals. For example, the response signals may be passed through a pre-amp component as shown in FIG. 10. Optionally, after the filtering at block 1206, the method further comprises amplifying the filtered signals (e.g. using another amplifier component).

At block 1208, one or more touch events are detected by measuring the filtered response signals. As described above, the response signals received from one or more resonant circuits may change due to capacitance added by a finger or other conductive object. The changes in output may, then, be used to determine the location(s) of the one or more touch events (e.g. in the X and Y axis), as described above.

The resonators used in the method of FIG. 12 may be tunable (e.g. tunable MEMs resonator), and the method may further comprise tuning one or more of the resonators to avoid interference. For example, where interference in one narrow band is detected, a resonant filter at or near that interference frequency may be tuned to a different resonance frequency to mitigate the interference, as discussed above.

It is to be understood that a combination of more than one of the approaches described above may be implemented. Embodiments are not limited to any particular one or more of the approaches, methods or apparatuses disclosed herein. One skilled in the art will appreciate that variations, alterations of the embodiments described herein may be made in various implementations without departing from the scope of the claims.

The invention claimed is:

1. A capacitive touch sensor system comprising:
   a substrate layer; and
   a plurality of resonant circuits, each comprising:
      a respective electrode, the electrodes of the plurality of resonant circuits being distributed on the substrate layer;
      a respective electromechanical resonator connected to the respective electrode, wherein each electromechanical resonator has a Quality (Q) factor of at least 200; and
      a respective pulling capacitor connected between the respective electrode and a device ground and in parallel with the electromechanical resonator, the pulling capacitor having a capacitance that shifts resonance of the resonant circuit away from a peak resonance frequency of the electromechanical resonator; and
   a signal generator that generates drive signals at about the peak resonance frequencies of the electromechanical resonators of the plurality of resonant circuits to drive the plurality of resonant circuits.

2. The capacitive touch sensor system of claim 1, wherein the electromechanical resonators comprise one or more ceramic resonators.

3. The capacitive touch sensor system of claim 1, wherein the electromechanical resonators comprise one or more crystal resonators.

4. The capacitive touch sensor system of claim 1, wherein the electromechanical resonators comprise one or more MEMs resonators.

5. The capacitive touch sensor system of claim 1, wherein each electromechanical resonator has a Q factor of at least 800.

6. The capacitive touch sensor system of claim 1, wherein the electromechanical resonators are tunable, such that the resonant circuits comprise tunable resonant filters.

7. The capacitive touch sensor system of claim 1, wherein each electromechanical resonator is connected between the respective electrode and a drive input.

8. The capacitive touch sensor system of claim 7, wherein each resonant circuit further comprises a resistor connected between the respective electrode and the drive input.

9. The capacitive touch sensor system of claim 1, wherein each resonant circuit further comprises a static discharge resistor connected in parallel with the capacitor between the respective electrode and ground.

10. The capacitive touch sensor system of claim 1, wherein the plurality of resonant circuits have a plurality of resonance frequencies.

11. The capacitive touch sensor system of claim 10, wherein the plurality of resonance frequencies are spaced apart from each other by a frequency separation of at least 40 kHz.

12. A system comprising:
a capacitive touch sensor of comprising: a substrate layer; and a plurality of resonant circuits, each resonant circuit comprising: a respective electrode, the electrodes of the plurality of resonant circuits being distributed on the substrate layer; and a respective electromechanical resonator connected to the respective electrode, wherein each electromechanical resonator has a Quality (Q) factor of at least 200; and a respective pulling capacitor connected between the respective electrode and a device ground and in parallel with the electromechanical resonator, the pulling capacitor having a capacitance that shifts resonance of the resonant circuit away from a peak resonance frequency of the electromechanical resonator; and
a controller operatively connected to the capacitive touch sensor apparatus, the controller comprising:
a processor;
a signal generator, operably connected to the processor, that generates, as output, drive signals at about the peak resonance frequencies of the electromechanical resonators of the plurality of resonant circuits to drive the capacitive touch sensor apparatus;
a broadband filter that receives, as input, signals output from the capacitive touch sensor apparatus; and
a detector that receives the signals from the capacitive touch sensor apparatus, thus filtered by the broadband filter.

13. The system of claim 12, wherein the broadband filter has a passband that encompasses all of the plurality of resonance frequencies.

14. The system of claim 12, the controller further comprising a pre-amplifier that amplifies the signals output from the capacitive touch sensor apparatus prior to the signals being input to the broadband filter.

15. The system of claim 12, the controller further comprising a switch, a first output terminal and a second output terminal, wherein the switch is controllable by the processor to selectively direct the drive signals to the first output terminal and the second output terminal.

16. A method for a capacitive touch sensor comprising a plurality of resonant circuits having a plurality of resonance frequencies, each of the resonant circuits comprising an electromechanical resonator having a Quality (Q) factor of at least 200, the method comprising:
exciting the plurality of resonant circuits with signals at about peak resonances of the electromechanical resonators of the plurality of resonance frequencies, each of the resonant circuits further comprising a respective pulling capacitor connected between a respective electrode and a device ground and in parallel with the electromechanical resonator, the pulling capacitor having a capacitance that shifts resonance of the resonant circuit away from a peak resonance frequency of the electromechanical resonator;
receiving response signals from the plurality of resonant circuits; and
detecting one or more touch events by measuring the response signals.

17. The method of claim 16, further comprising filtering the response signals with a broadband filter, wherein the broadband filter has a passband that encompasses the plurality of resonance frequencies.

18. The method of claim 17, further comprising, prior to said filtering, amplifying the response signals.

19. The method of claim 17, further comprising, after said filtering, amplifying the filtered response signals.

20. The method of claim 16, wherein the electromechanical resonators comprise at least one of: ceramic resonators; crystal resonators; and MEMs resonators.

* * * * *

UNITED STATES PATENT AND TRADEMARK OFFICE
CERTIFICATE OF CORRECTION

| | |
|---|---|
| PATENT NO. | : 11,126,316 B2 |
| APPLICATION NO. | : 16/956414 |
| DATED | : September 21, 2021 |
| INVENTOR(S) | : Robert Donald McCulloch et al. |

Page 1 of 1

It is certified that error appears in the above-identified patent and that said Letters Patent is hereby corrected as shown below:

In the Claims

In Claim 12, Column 25, Line 37, delete "sensor" and insert --sensor apparatus--.

Signed and Sealed this
Twenty-second Day of February, 2022

Drew Hirshfeld
*Performing the Functions and Duties of the
Under Secretary of Commerce for Intellectual Property and
Director of the United States Patent and Trademark Office*